United States Patent [19]
Singh et al.

[11] Patent Number: 6,121,633
[45] Date of Patent: Sep. 19, 2000

[54] LATCH-UP FREE POWER MOS-BIPOLAR TRANSISTOR

[75] Inventors: Ranbir Singh, Cary; John W. Palmour, Raleigh, both of N.C.

[73] Assignee: Cree Research, Inc., Durham, N.C.

[21] Appl. No.: 09/082,554

[22] Filed: May 21, 1998

Related U.S. Application Data

[63] Continuation-in-part of application No. 08/891,221, Jul. 10, 1997, Pat. No. 5,969,378.
[60] Provisional application No. 60/049,423, Jun. 12, 1997.

[51] Int. Cl.[7] .............................................. H01L 31/0312
[52] U.S. Cl. ............................. 257/77; 257/212; 257/623
[58] Field of Search ........................... 257/77, 133, 378, 257/212, 139, 141, 623, 153

[56] References Cited

U.S. PATENT DOCUMENTS

| | | | |
|---|---|---|---|
| 4,048,649 | 9/1977 | Bohn | 257/330 |
| 4,329,705 | 5/1982 | Baker | 257/330 |
| 4,725,562 | 2/1988 | El-Kareh et al. | 257/514 |
| 4,799,095 | 1/1989 | Baliga | 357/38 |
| 4,945,394 | 7/1990 | Palmour et al. | 357/34 |
| 4,981,551 | 1/1991 | Palmour | 156/643 |
| 5,014,102 | 5/1991 | Adler | 257/38 |
| 5,087,576 | 2/1992 | Edmond et al. | 437/22 |
| 5,168,331 | 12/1992 | Yilmaz | 257/331 |
| 5,170,231 | 12/1992 | Fujii et al. | 357/23.2 |
| 5,202,750 | 4/1993 | Gough | 257/133 |
| 5,233,215 | 8/1993 | Baliga | 257/490 |
| 5,264,713 | 11/1993 | Palmour | 257/77 |
| 5,270,554 | 12/1993 | Palmour | 257/77 |
| 5,304,821 | 4/1994 | Hagino | 257/133 |
| 5,323,040 | 6/1994 | Baliga | 257/332 |
| 5,331,194 | 7/1994 | Ueno | 257/498 |
| 5,396,085 | 3/1995 | Baliga | 257/77 |
| 5,459,107 | 10/1995 | Palmour | 437/238 |
| 5,488,236 | 1/1996 | Baliga et al. | 257/132 |
| 5,489,787 | 2/1996 | Amaratunga et al. | 257/137 |
| 5,506,421 | 4/1996 | Palmour | 257/77 |
| 5,539,217 | 7/1996 | Edmond et al. | 257/77 |
| 5,679,966 | 10/1997 | Baliga et al. | 257/77 |
| 5,719,409 | 2/1998 | Singh et al. | 257/330 |
| 5,723,891 | 3/1998 | Malhi | 257/341 |
| 5,895,939 | 4/1999 | Ueno | 257/279 |
| 5,917,203 | 6/1999 | Bhatnagar et al. | 257/139 |
| 5,969,378 | 10/1999 | Singh | 257/77 |

FOREIGN PATENT DOCUMENTS

| | | | |
|---|---|---|---|
| 0 159 663 A3 | 4/1985 | European Pat. Off. | H01L 29/78 |
| 2524711 | 10/1983 | France | H01L 27/06 |
| 61-104667A | 9/1986 | Japan | H01L 29/78 |
| 63-047983 | 2/1988 | Japan | H01L 29/80 |
| 4-029368 | 1/1992 | Japan | H01L 29/784 |
| 5-082792 | 4/1993 | Japan | 257/330 |
| WO 89/04056 | 5/1989 | WIPO | H01L 21/265 |

OTHER PUBLICATIONS

Narayanan, E. M. Sankara, et al., CMOS compatible 250 V Lateral Insulated Base Transsistors,*3rd International Symposium on Power Semiconductor Devices and ICs*, pp. 181–186 (1991).

(List continued on next page.)

*Primary Examiner*—Sara Crane
*Attorney, Agent, or Firm*—Myers Bigel Sibley & Sajovec

[57] ABSTRACT

A MOS bipolar transistor is provide which includes a silicon carbide npn bipolar transistor formed on a bulk single crystal n-type silicon carbide substrate and having an n-type drift layer a p-type base layer. Preferably the base layer is formed by epitaxial growth and formed as a mesa. A silicon carbide nMOSFET is formed adjacent the npn bipolar transistor such that a voltage applied to the gate of the nMOSFET causes the npn bipolar transistor to enter a conductive state. The nMOSFET has a source and a drain formed so as to provide base current to the npn bipolar transistor when the bipolar transistor is in a conductive state. Also included are means for converting electron current flowing between the source and the drain into hole current for injection into the p-type base layer. Means for reducing field crowding associated with an insulating layer of said nMOSFET may also be provided.

21 Claims, 18 Drawing Sheets

OTHER PUBLICATIONS

Parpia, Zahir, et al., A Novel CMOS–Compatible High–Voltage Transistor Structure, *I.E.E.E. Transactions on Electron Devices*, pp. 1948–1952 (1986).

O, Kenneth, et al., PMOS Input Merged Bipolar–Sidewall MOS Transistors (PBiMOS Transistors), *IEEE Electron Device Letters*, vol. 12, No. 2, pp. 68–70 (New York, 1991).

PCT International Search Report, PCT/US98/12007, Sep. 30, 1998.

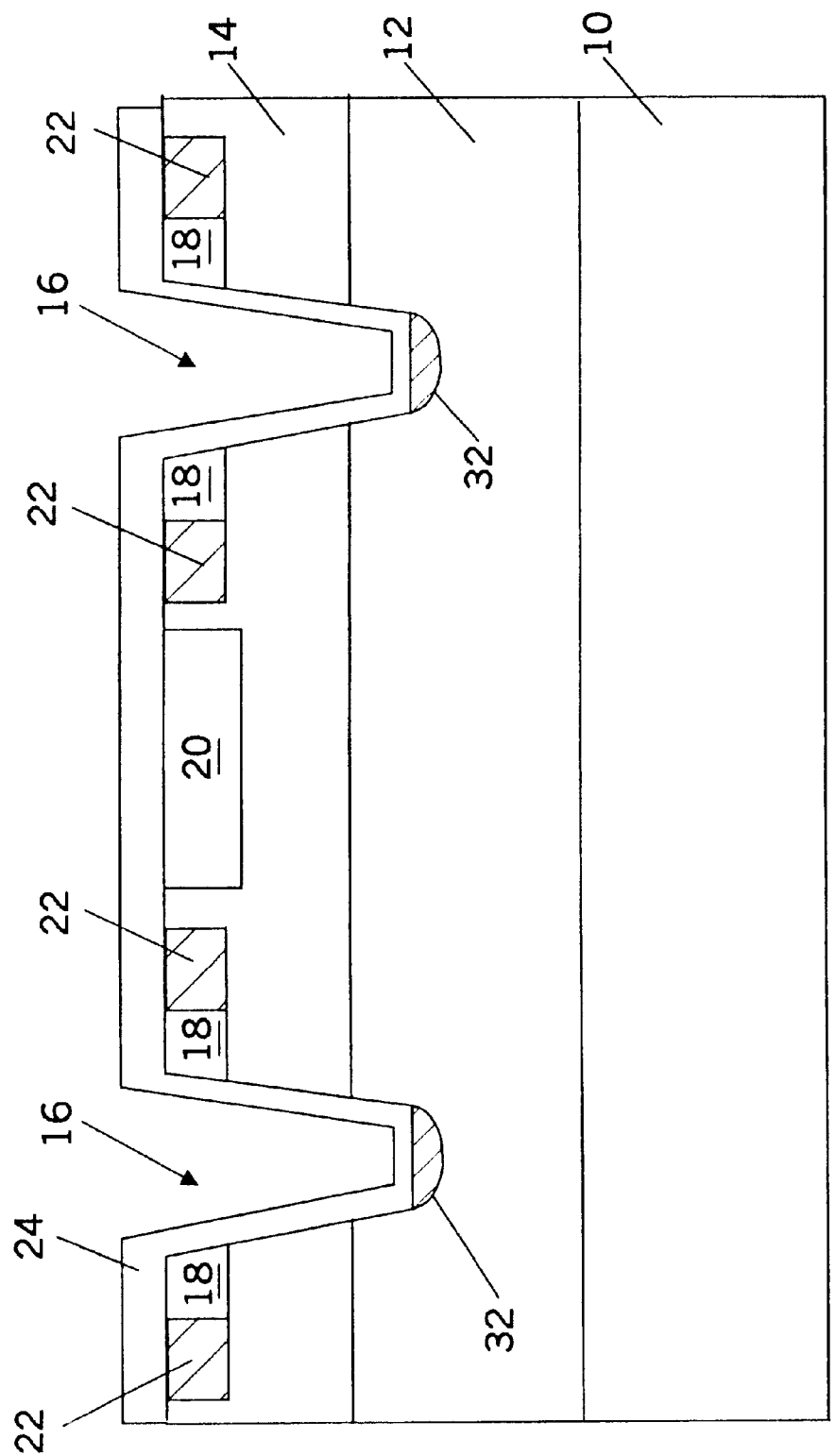

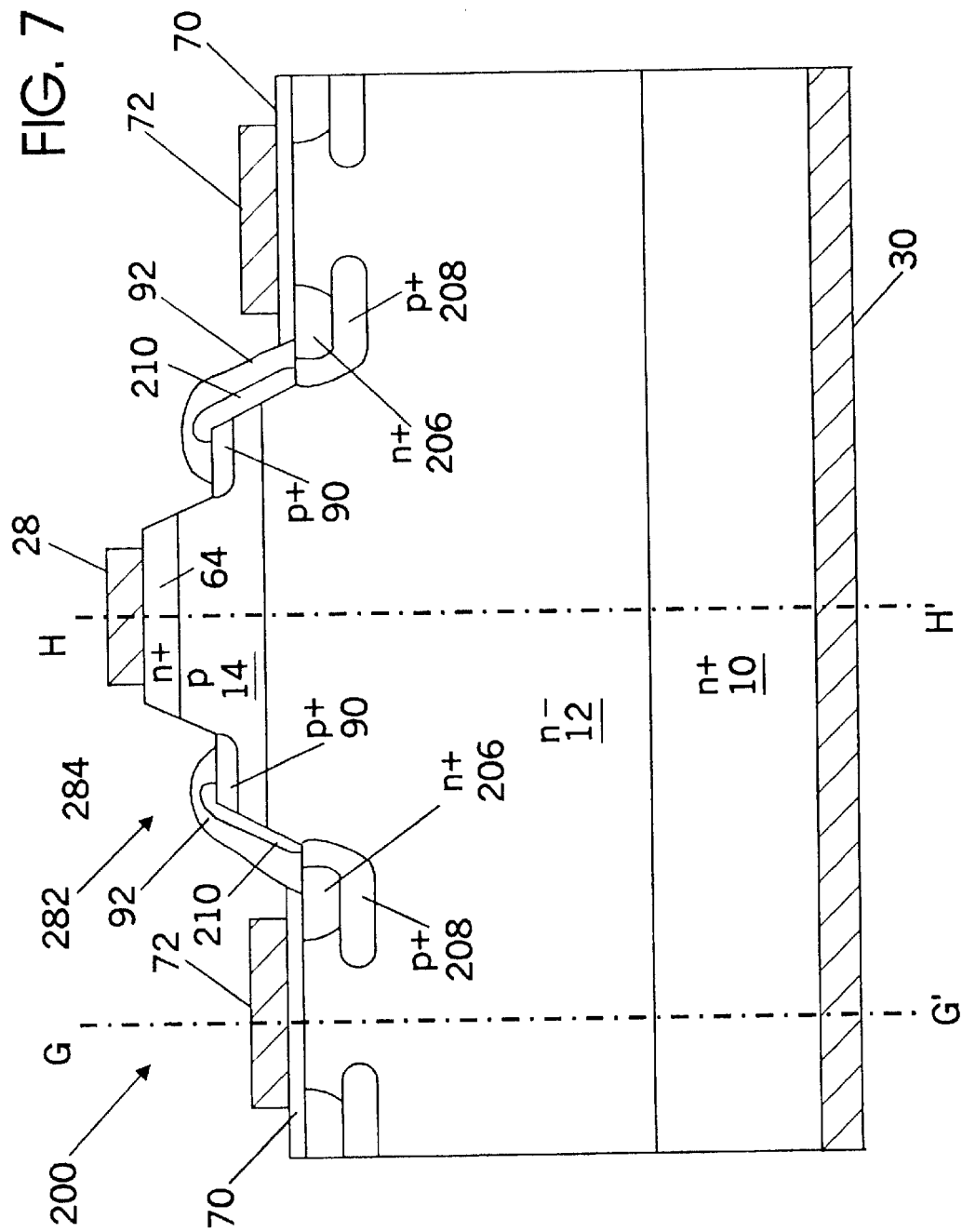

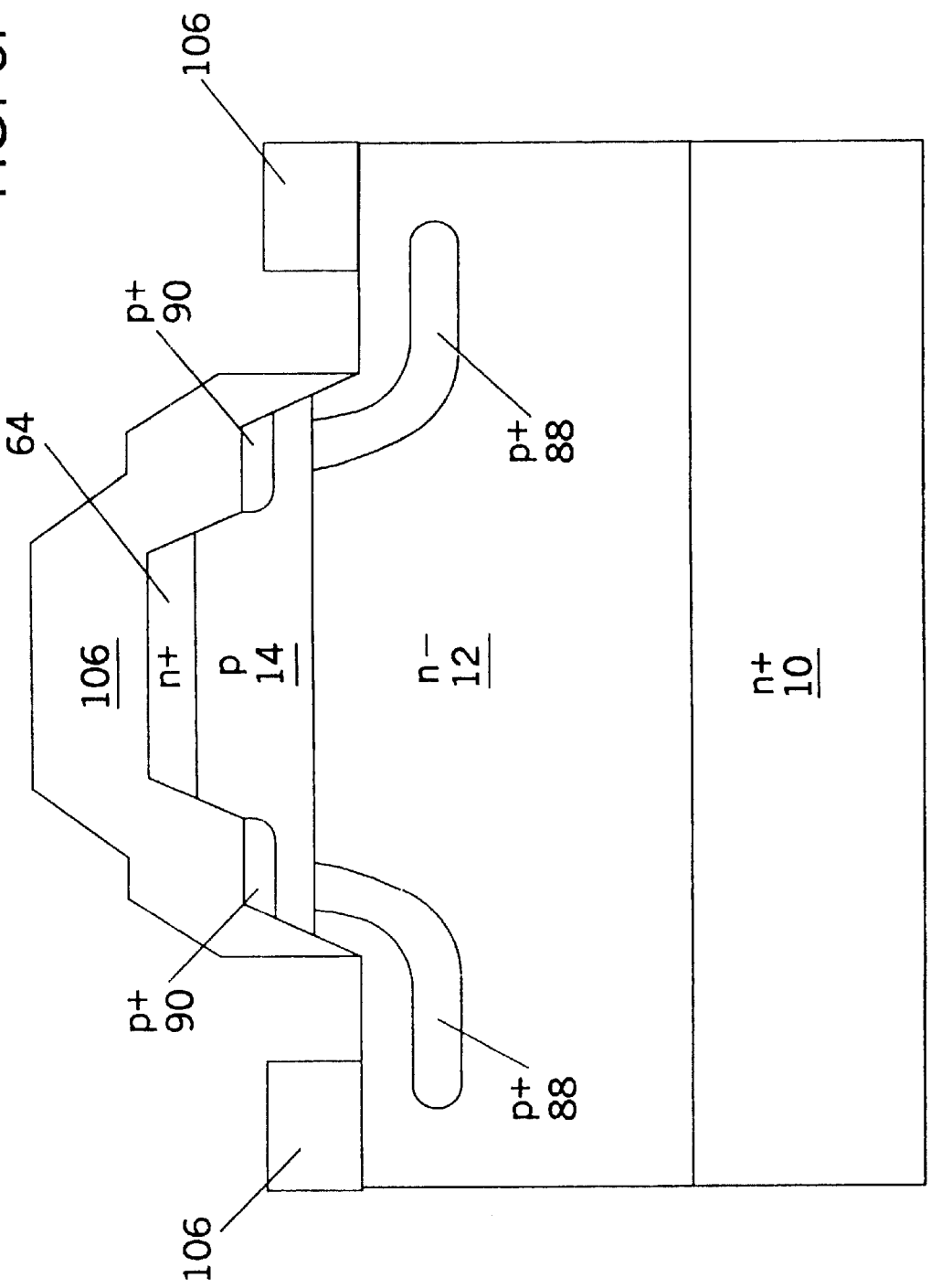

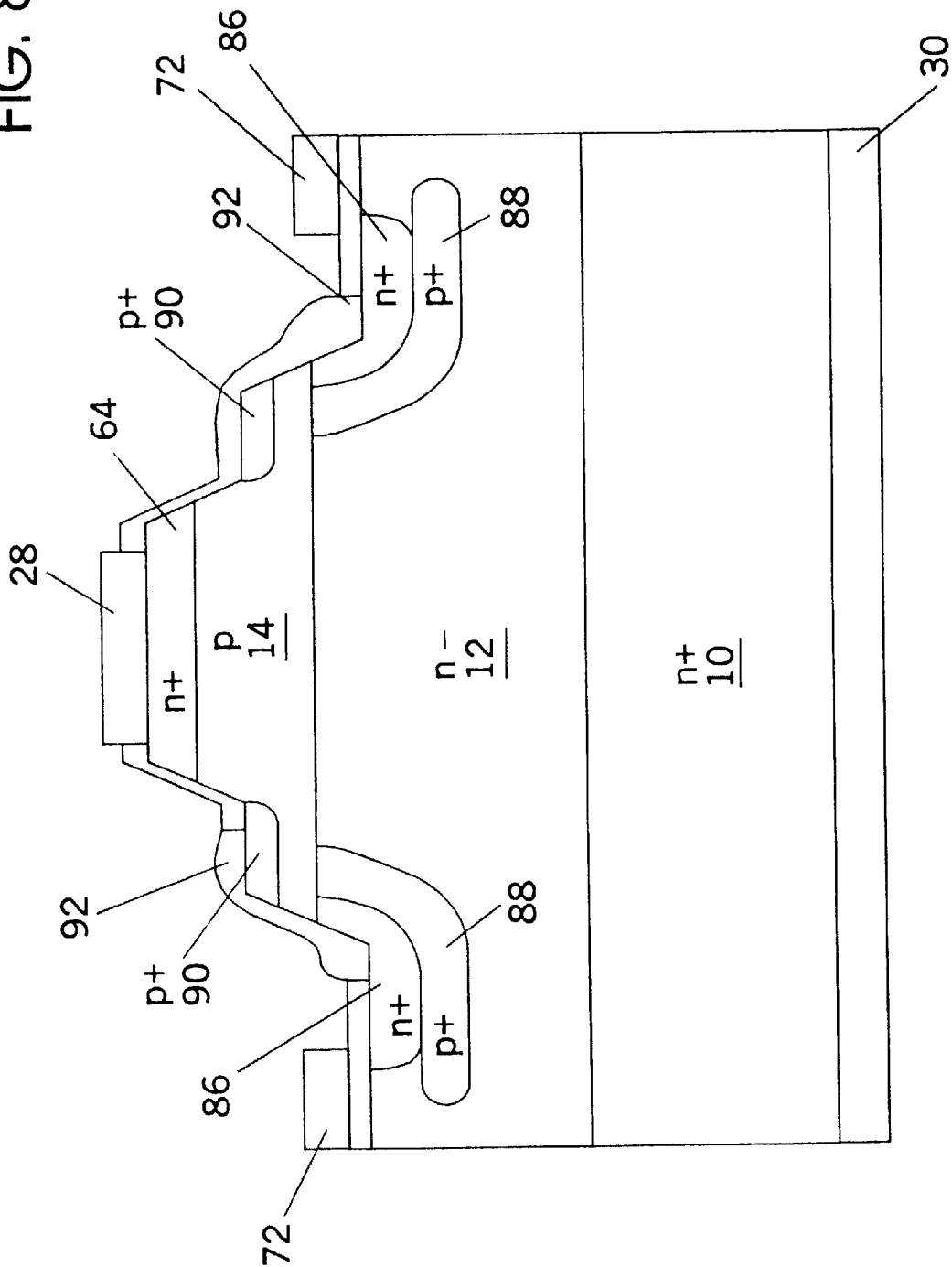

LATCH-UP FREE POWER MOS-BIPOLAR TRANSISTOR

RELATED APPLICATION

The present application is a continuation in part of U.S. patent application Ser. No. 08/891,221 filed Jul. 10, 1997, now U.S. Pat. No. 5,969,378, which is related to and claims priority from U.S. Provisional patent application Ser. No. 60/049,423, filed Jun. 12, 1997 and entitled LATCHUP-FREE POWER UMOS-BIPOLAR TRANSISTOR (LMBT).

FIELD OF THE INVENTION

The present invention relates to semiconductor devices and more particularly to such devices formed in silicon carbide. The present invention particularly relates to power transistors formed in silicon carbide.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 200 to 50 A/cm$^2$ and support relatively high blocking voltages in the range of 500–2500V.

Despite the attractive power ratings achieved by bipolar transistors, there exist several fundamental drawbacks to their suitability for all high power applications. Bipolar transistors are current controlled devices which require relatively large base control currents, typically one fifth to one tenth of the collector current, to maintain the transistor in an on-state mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary. This current diversion generally results from the decrease in on-state voltage drop across the bipolar device with further increases in operating temperature.

The silicon power MOSFET was developed to address this base drive problem. In a power MOSFET, the gate electrode provides turn-on and turn-off control upon the application of an appropriate gate bias. For example, turn-on in an n-type enhancement MOSFET occurs when a conductive n-type inversion layer is formed in the p-type channel region in response to the application of a positive gate bias. The inversion layer electrically connects the n-type source and drain regions and allows for majority carrier conduction between source and drain.

The power MOSFET's gate electrode is separated from the conducting channel region by an intervening insulating layer, typically silicon dioxide. Because the gate is insulated from the channel region, little gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented.

Moreover, because current conduction in the MOSFET occurs through majority carrier transport only, the delay associated with the recombination of excess minority carriers is not present. Accordingly, the switching speed of power MOSFETs can be made orders of magnitude faster than that of bipolar transistors. Unlike bipolar transistors, power MOSFETs can be designed to simultaneously withstand high current densities and the application of high voltages for relatively long durations, without encountering the destructive failure mechanism known as "second breakdown". Power MOSFETs can also easily be paralleled, because the forward voltage drop of power MOSFETs increases with increasing temperature, thereby promoting an even current distribution in parallel connected devices.

The above-described beneficial characteristics of power MOSFETs are typically offset, however, by the relatively high on-resistance of the MOSFET's drift region for high voltage devices, which arises from the absence of minority carrier injection. As a result, a MOSFET's operating forward current density is typically limited to relatively low values, typically in the range of 40–50 A/cm$^2$, for a 600 V device, as compared to 100–120 A/cm$^2$ for the bipolar transistor for an identical on-state voltage drop.

On the basis of these features of power bipolar transistors and MOSFET devices, devices embodying a combination of bipolar current conduction with MOS-controlled current flow were developed and found to provide significant advantages over single technologies such as bipolar or MOSFET alone. One example of a device which combines bipolar and MOS characteristics is the Insulated Gate Bipolar Transistor (IGBT).

The IGBT combines the high impedance gate of the power MOSFET with the small on-state conduction losses of the power bipolar transistor. Because of these features, the IGBT has been used extensively in inductive switching circuits, such as those required for motor control applications. These applications require devices having wide forward-biased safe-operating-area (FBSOA) and wide reverse-biased safe-operating-area (RBSOA).

One disadvantage of an IGBT is its limited gate control on-state current density. This arises from the presence of a parasitic thyristor in its structure. At sufficiently high on-state current densities, this thyristor latches up, thereby losing gate control over the on current. This characteristic of IGBT's also limits the IGBT's surge current capability. Many proposals have been made for mechanisms to suppress the effectiveness of this parasitic thyristor at the cost of on-state voltage drop and/or switching speed.

Recent efforts have also included investigation of the use of silicon carbide (SiC) devices for power devices. Such devices include power MOSFETs such as are described in U.S. Pat. No. 5,506,421. Similarly, silicon carbide Junction Field Effect Transistors (JFETs) and Metal-Semiconductor Field Effect Transistors (MESFETs) have also been proposed for high power applications. See U.S. Pat. Nos. 5,264,713 and 5,270,554. These devices, however, have a forward voltage drop of approximately 3 volts as a minimum voltage drop. Thus, these devices are not suitable for all applications.

Silicon carbide IGBTs may further provide improved performance over other power devices because the forward voltage drop of the device does not increase with breakdown voltage at the same rate for an IGBT as for a MOSFET or JFET. As is illustrated in FIG. 1, the curve of breakdown voltage (BV) versus forward voltage drop (Vf) for a MOSFET/JFET 8 crosses the curve for a silicon carbide IGBT 9 at about 2000V. Thus, for breakdown voltages of greater than 2000V silicon carbide IGBTs may provide better performance in terms of forward voltage drop for the same breakdown voltage than silicon MOSFETs or JFETs.

While the characteristics of the silicon carbide IGBT indicate promise as a power device, such devices are currently limited in their applicability in silicon carbide. These limitations are a result of the present difficulties in fabricating good quality highly doped p-type silicon carbide substrates. Another limitation is the very low hole mobility in silicon carbide, thereby making it very susceptible to parasitic thyristor latch-up. Therefore, silicon carbide IGBTs are expected to have a low value of gate controlled on-state current density. Because the IGBT is typically a vertical device, the substrate on which the device is fabricated may be critical to device performance. The quality of the substrate material may be a limiting factor in the fabrication of quality devices. Thus, the difficulty in manufacturing good quality highly doped p-type silicon carbide substrates may presently limit the fabrication of IGBTs to n-type substrates.

In conventional power circuits it is desirable to have a device which may have the control voltage applied to the device to turn the device on and off referenced to ground rather than to a high positive voltage level. However, to provide an IGBT where the gate is referenced to the emitter of the device generally requires a highly doped p-type substrate. As is noted above, highly doped p-type substrates currently are more difficult to fabricate than n-type substrates in silicon carbide. With an n-type substrate a silicon carbide IGBT would have its gate voltage referenced to the collector voltage which, in a typical power circuit would be to a line voltage. Thus, present silicon carbide IGBTs may require more complex gate drive circuitry with level shifting components and result in more complex power circuits as a result of the structure of IGBTs, the electrical characteristics of silicon carbide and the limitations in fabrication of highly doped p-type silicon carbide substrates.

In light of the above discussion, there exists a need for improvements in high power silicon carbide devices.

OBJECT AND SUMMARY OF THE INVENTION

In view of the foregoing, it is one object of the present invention to provide a silicon carbide power device.

A further object of the present invention is to provide a silicon carbide power device which is voltage controlled.

Yet another object of the present invention is to provide a silicon carbide power device which may have its control voltage referenced to ground in typical power circuits while the collector voltage is capable of blocking a positive high voltage.

Still another object of the present invention is to provide a silicon carbide power device which may be fabricated on an n-type silicon carbide substrate.

Another object of the present invention is to provide a bipolar transistor which may be paralleled with other bipolar transistors with reduced instability arising from the decreasing on-state voltage drop of bipolar transistors with an increase in operating temperature.

Yet another object of the present invention is to provide a silicon carbide power device with an increased breakdown voltage.

Another object of the present invention is to provide silicon carbide MOS control with reduced susceptibility to gate dielectric breakdown during reverse bias mode of operation.

These and other objects of the present invention are provided by a MOS bipolar transistor which includes a silicon carbide npn bipolar transistor formed on a bulk single crystal highly doped n-type silicon carbide substrate and having an n-type drift layer a p-type base layer. Preferably the base layer is formed by epitaxial growth and formed as a mesa. A silicon carbide nMOSFET is formed adjacent the npn bipolar transistor such that a voltage applied to the gate of the nMOSFET causes the npn bipolar transistor to enter a conductive state. The nMOSFET has a source and a drain formed so as to provide base current to the npn bipolar transistor when the bipolar transistor is in a conductive state. Also included are means for converting electron current flowing between the source and the drain of the MOSFET into hole current for injection into the p-type base layer of the npn transistor. Means for reducing field crowding associated with an insulating layer of said nMOSFET may also be prodvided. Preferably, the nMOSFET is an accumulation mode device.

In particular embodiments, the means for converting comprises a silicon carbide tunnel diode formed between the nMOSFET and the npn bipolar transistor so as to convert electron current flowing through the nMOSFET into hole current for injection into the base layer of the npn bipolar transistor. In such an embodiment the silicon carbide nMOSFET has an n-type conductivity source region and the tunnel diode is formed by forming a region of p-type conductivity silicon carbide having a higher carrier concentration than the p-type base layer adjacent the n-type conductivity source region so as to form a conductive p-n tunnel junction between the source region and the p-type conductivity region.

In one embodiment of the present invention, the means for converting includes a region of p-type conductivity silicon carbide in the p-type base layer and having a higher carrier concentration than the p-type base layer and an electrically conductive strap for electrically connecting the n-type source region of the nMOSFET to the region of p-type conductivity silicon carbide. Furthermore, the means for reducing field crowing may include a region of p-type conductivity silicon carbide formed in the drift layer beneath and spaced apart from the insulating layer and extending to the base layer.

In an embodiment having a mesa for the base layer, the sidewalls of the mesa may include a step portion. In such a case, a region of p-type conductivity silicon carbide may be formed in the p-type base layer at the step portion and having a higher carrier concentration than the p-type base layer. An electrically conductive strap electrically connects the n-type source region of the nMOSFET to the region of p-type conductivity silicon carbide.

In still another embodiment, where the mesa has sloped sidewalls, the slope of the sidewalls provides a predefined doping profile associated with the means for reducing field crowding.

Through the utilization of a region of p-type silicon carbide formed in the drift layer in proximity to the gate of the nMOSFET field crowding in the area of the gate may be reduced, thus increasing the breakdown voltage of the MOSFET. The formation of this region of p-type conductivity material may be facilitated by the formation of the base layer as a mesa having sloped sidewalls. The slope of the sidewall may then cooperate with the implantation process to provide the desired doping profile. Furthermore, by forming the base layer as a mesa the base layer may be formed by epitaxial growth and without the defects which may be caused by ion implantation in a significant portion of the base layer. The damage in the ion implanted base layer may lead to low npn transistor gain which may result in a high on-state voltage drop.

In another embodiment, the means for converting includes a region of p-type conductivity silicon carbide formed in the p-type base layer and having a higher carrier concentration than the p-type base layer and forming an electrically conductive strap for electrically connecting the n-type source region of the nMOSFET to the region of p-type conductivity silicon carbide.

In particular embodiments of the present invention, the silicon carbide nMOSFET comprises a UMOSFET having a gate trench formed adjacent the npn bipolar transistor and having a source region formed so as to provide electrons to the means for converting and wherein the npn bipolar transistor comprises a vertical npn bipolar transistor. Furthermore, the MOS bipolar transistor may be formed of a plurality of unit cells so as to provide a plurality of electrically parallel npn bipolar transistors.

By forming a MOS gated bipolar transistor where the electron current flow in the MOS transistor is converted to hole current flow for injection into the bipolar transistor as base current, a voltage controlled bipolar device is provided. Furthermore, because the bipolar device is an npn device the bipolar transistor may be formed on an n-type silicon carbide substrate. Thus, the disadvantages of using a p-type substrate may be overcome. Also, because the device is an npn bipolar device the emitter of the device may be grounded which allows the gate control to be referenced to ground. Thus, in power circuits, devices of the present invention may utilize a ground referenced control circuit.

Furthermore, because base current of the bipolar device is injected from a MOS inversion channel which uses n channel conduction, the impact of low electron inversion layer mobility of silicon carbide may be reduced. Also, the characteristics of the MOS transistor which supplies base current to the bipolar device may tend to stabilize operation of multiple paralleled bipolar devices. Thus, while on-state resistance of the bipolar device decreases with increased temperature, on-state resistance of the base drive MOS transistor increases with temperature. The increased resistance of the MOS base drive transistor results in reduced base current in the bipolar device which then results in reduced current flow through the bipolar transistor. Therefore, even if the on-state resistance of the bipolar transistor reduces with temperature the current through the transistor may be reduced because of the reduced base current supplied by the MOS transistor. This interaction may provide added benefit where devices according to the present invention are comprised of a unit cell which may be replicated to provide for multiple electrically parallel bipolar transistors in a single substrate to allow increased current capability.

Devices according to the present invention also have no possibility of latch-up. The present devices are latch-up free because no parasitic thryistor exists in the structure of the present invention in contrast to the structure of an IGBT.

Devices according to the present invention also provides a wide forward bias safe operating area because of the presence of current saturation mode. Also devices according to the present invention have a large reverse bias safe operating area because of the higher impact ionization rate of holes than electrons in 4H-SiC. These characteristics are especially suitable for inductive switching applications.

In addition to embodiments described above, the present invention also provides a unit cell of a UMOS bipolar transistor which includes an n-type bulk single crystal silicon carbide substrate and an n-type silicon carbide drift layer formed on the n-type conductivity bulk single crystal silicon carbide substrate. The n-type drift layer has a carrier concentration of less than the n-type silicon carbide substrate. A p-type silicon carbide base layer is formed on the n-type silicon carbide drift layer and a first region of n-type silicon carbide is formed in the p-type base layer. A gate trench is formed in the p-type base layer and extends through the base layer and a portion of the first region of n-type silicon carbide to the drift layer to provide a portion of the first n-type region as a portion of the sidewall of the gate trench. An insulating layer is formed on the bottom and sidewalls of the gate trench and a second region of n-type conductivity silicon carbide is formed in the base layer adjacent and disposed from the gate trench. A conductive gate contact is formed on the insulating layer and extending over a portion of the first n-type region. A collector contact is formed on a surface of the silicon carbide substrate opposite the drift layer. A p-type region of silicon carbide is formed in the base layer and is disposed between the first n-type region and the second n-type region. The p-type region has a carrier concentration greater than the carrier concentration of the p-type base layer and is formed so as to provide a reservoir of holes that convert electron current flowing through the first n-type region into hole current for injection into said p-type base layer. Finally, an emitter contact is formed on the second n-type region of silicon carbide.

In particular embodiments, a second p-type region of silicon carbide formed in the n-type silicon carbide drift region at the bottom of the gate trench is also provided. This second p-type region preferably has a carrier concentration greater than the carrier concentration of the n-type drift layer.

In another embodiment, the first p-type region forms a p-n junction with the first n-type region so as to provide a tunnel diode. Alternatively, a conductive strap formed between the first n-type region and the p-type region may be provided to electrically connect the p-type region to the first n-type region.

In particular embodiments of the present invention, the p-type base layer has a thickness of from about 0.3 $\mu$m to about 5 $\mu$m. The n-type drift region may have a thickness of from about 3 $\mu$m to about 500 $\mu$m. The n-type drift region may also have a carrier concentration of from about $1 \times 10^{12}$ cm$^{-3}$ to about $1 \times 10^{17}$ cm$^{-3}$ and the p-type base layer may have a carrier concentration of from about $1 \times 10^{16}$ cm$^{-3}$ to about $1 \times 10^{18}$ cm$^{-3}$.

In still another embodiment of the present invention, a MOS gated bipolar transistor is provided which includes a plurality of the unit cells according to the present invention.

The present invention also includes methods of forming the devices described above. These methods have the further advantage of allowing for fabrication of devices according to the present invention on the same substrate as UMOSFET silicon carbide transistors. Thus, the present invention also includes methods which include the steps of forming an n-type silicon carbide drift layer on an n-type bulk single crystal silicon carbide substrate and forming a p-type silicon carbide base layer on the n-type silicon carbide drift layer.

Ions are implanted through a first masking layer so as to form n-type regions of silicon carbide in the base layer to provide an emitter region and a drain region. Ions are also implanted through a second masking layer so as to form a p-type region of silicon carbide adjacent the source region. A trench is etched through a portion of the n-type source region and through the base layer and into the drift layer so as provide a gate trench. An insulating layer is formed on exposed surfaces of the base layer and the trench and a conductive contact is formed and patterned in the trench and on the base layer so as to provide a gate contact. A portion of the insulating layer is removed to expose the emitter region formed in the base layer and an emitter contact formed on the exposed emitter region. A source/collector contact is formed on a surface of the silicon carbide substrate opposite the drift layer.

In another embodiment of the methods according to the present invention, the step of implanting through a masking layer is followed by the step of annealing the resultant structure at a temperature of greater than about 1500° C. The methods may also include forming a p-type silicon carbide region in the n-type drift layer below the bottom of the trench.

In another embodiment of the methods of the present invention, a portion of the n-type source region and the p-type region of higher carrier concentration formed in the base layer are exposed and a conductive strap is formed on the exposed portions to electrically connect the n-type source region to the p-type region.

In still further embodiments of the present invention, a unit cell of a MOS bipolar transistor is provided having an n-type bulk single crystal silicon carbide substrate and an n-type silicon carbide drift layer adjacent the n-type conductivity bulk single crystal silicon carbide substrate. The n-type drift layer has a carrier concentration of less than the n-type silicon carbide substrate. A p-type epitaxial silicon carbide base layer is formed on the n-type silicon carbide drift layer and a first n-type region of silicon carbide is formed in the p-type base layer adjacent a surface opposite the n-type silicon carbide drift layer. The p-type epitaxial silicon carbide base layer is formed as a mesa having a sidewall which extends through the p-type epitaxial silicon carbide base layer and to the n-type drift layer.

An insulating layer is formed on the n-type drift layer adjacent and disposed from the sidewall and a second n-type conductivity region of silicon carbide is formed in the drift layer adjacent the sidewall of the mesa. The second-n-type conductivity region has a higher carrier concentration than said drift layer. A gate contact is formed on the insulating layer and extending over a portion of the first n-type region. A collector contact is formed on a surface of the silicon carbide substrate opposite the drift layer. A first p-type region of silicon carbide is formed in the base layer and a second p-type region is formed adjacent the second n-type conductivity region and extending into the n-type drift region below the second n-type conductivity region and below the gate contact. The p-type regions have a carrier concentration greater than the carrier concentration of the p-type epitaxial base layer. The first p-type region is formed so as to convert electrons flowing through the first n-type region into holes for injection into the p-type base layer. A conductive strap is also formed at base of the sidewall so as to electrically connect the second n-type conductivity regions with the first p-type region of silicon carbide and an emitter contact is formed on the first n-type region of silicon carbide.

In a particular embodiment, the first and second regions of p-type silicon carbide comprise a continuous region of p-type silicon carbide formed in the base layer adjacent a sidewall of the mesa and the second n-type conductivity region and extending into and below the gate contact.

In a further embodiment, the sidewall has a slope of less than about 60 degrees. The slope of the sidewall may be selected so as to produce the p-type region of silicon carbide when p-type ions are implanted at a predetermined depth in the drift layer.

In a further embodiment, the sidewall comprises two sidewalls so as to provide a step in the sidewall of said mesa. In such a case, the first p-type region of silicon carbide includes a first p-type region of silicon carbide formed in the p-type epitaxial base layer adjacent the step and a second p-type region of silicon carbide formed in the n-type drift layer. The second p-type region is formed adjacent the second n-type conductivity region and extends from the n-type drift layer below the gate contact to the p-type base layer. The conductive strap connects the first p-type region with the second p-type region and the second n-type conductivity region.

The unit cell of particular embodiments of the present invention may also have the second p-type region formed so as to be exposed at a surface of the drift layer. In such a case, the conductive strap electrically connects the first p-type region with the second p-type region and the second n-type region. Furthermore, an insulating layer may be formed on the sidewall of the mesa between the drift layer and the step and extending onto the step. The conducting strap may then be formed on the insulating layer.

In particular embodiments, the p-type base layer has a thickness of from about 0.3 $\mu$m to about 5 $\mu$m. The n-type drift region may also have a thickness of from about 3 $\mu$m to about 500 $\mu$m. The n-type drift region may have a carrier concentration of from about $10^{12}$ to about $10^{17}$ cm$^{-3}$ and the p-type epitaxial base layer a carrier concentration of from about $10^{16}$ to about $10^{18}$ cm$^{-3}$. The p-type region may extend beneath the gate contact a distance of from about 3 $\mu$m to about 12 $\mu$m. The second n-type conductivity region be formed in the n-type drift layer to a depth of from about 0.3 $\mu$m to about 5 $\mu$m.

In further embodiments, the insulating layer comprises an oxide layer. Also, a MOS gated bipolar transistor may be formed by a plurality of the unit cells of the present invention. Methods for providing unit cells and transistors according to the present invention are also provided.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DESCRIPTION OF THE DRAWINGS

FIGS. 4A through FIG. 4J are cross sectional views illustrating the fabrication of a power device according to the present invention;

FIG. 7 is a cross-sectional view of a plurality of unit cells of a power device according to a third alternative embodiment of the present invention; and FIGS. 8A through FIG. 8H are cross sectional views illustrating the fabrication of a power device according to an alternative embodiment of the present invention.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, references herein to a layer formed "on" a substrate or other layer may refer to the layer formed directly on the substrate or other layer or on an intervening layer or layers formed on the substrate or other layer. As will also be appreciated by those of skill in the art, while the present invention is described with respect to layers, such layers may be formed epitaxially or by implantation. Accordingly, the present invention is not limited to the relative size and spacing illustrated in the accompanying figures.

Figure 1:
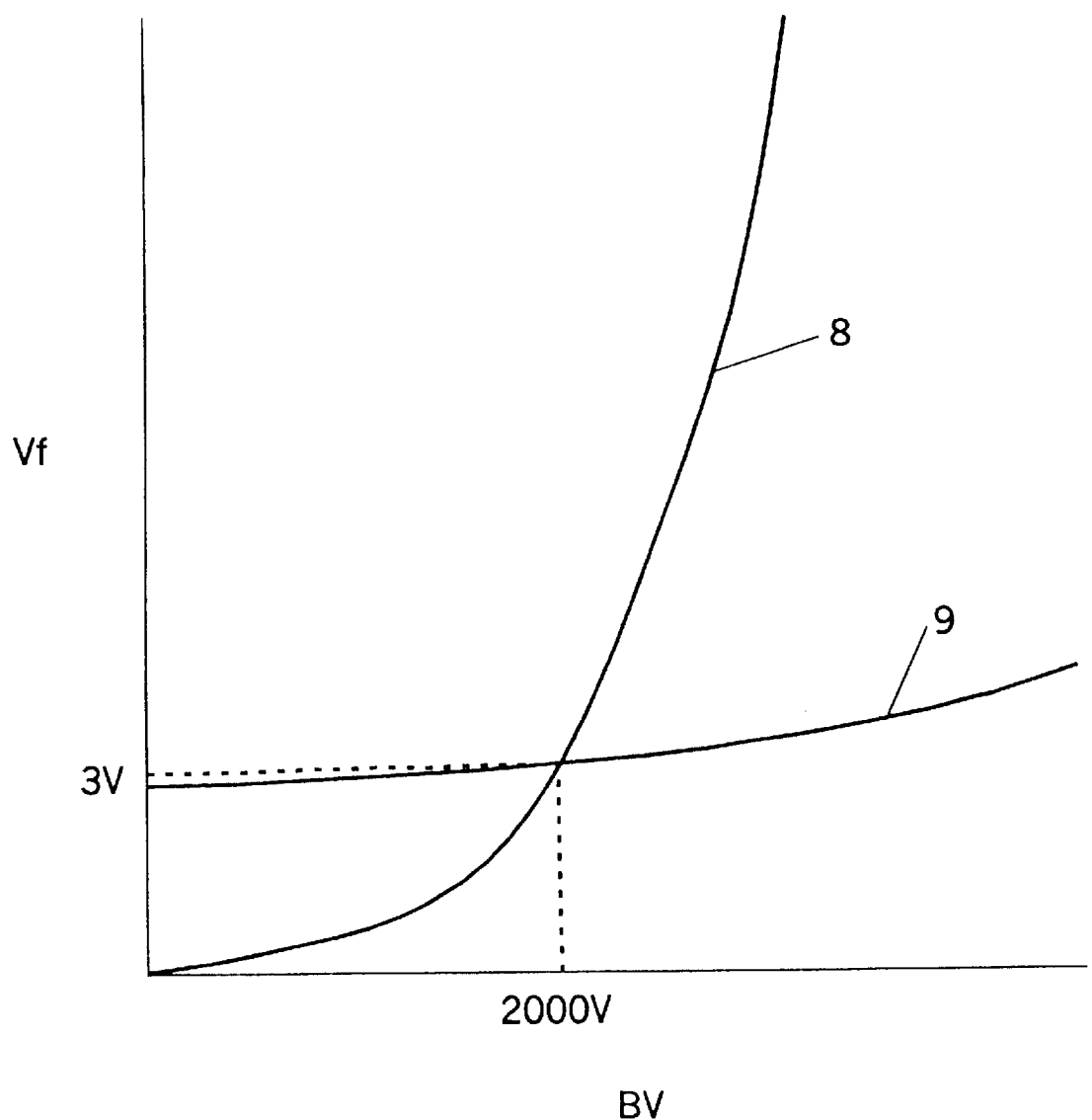
FIG. 1 is a graph of breakdown voltage versus forward voltage drop for silicon MOSFETs and JFETs and silicon carbide IGBTs.
Figure 2:
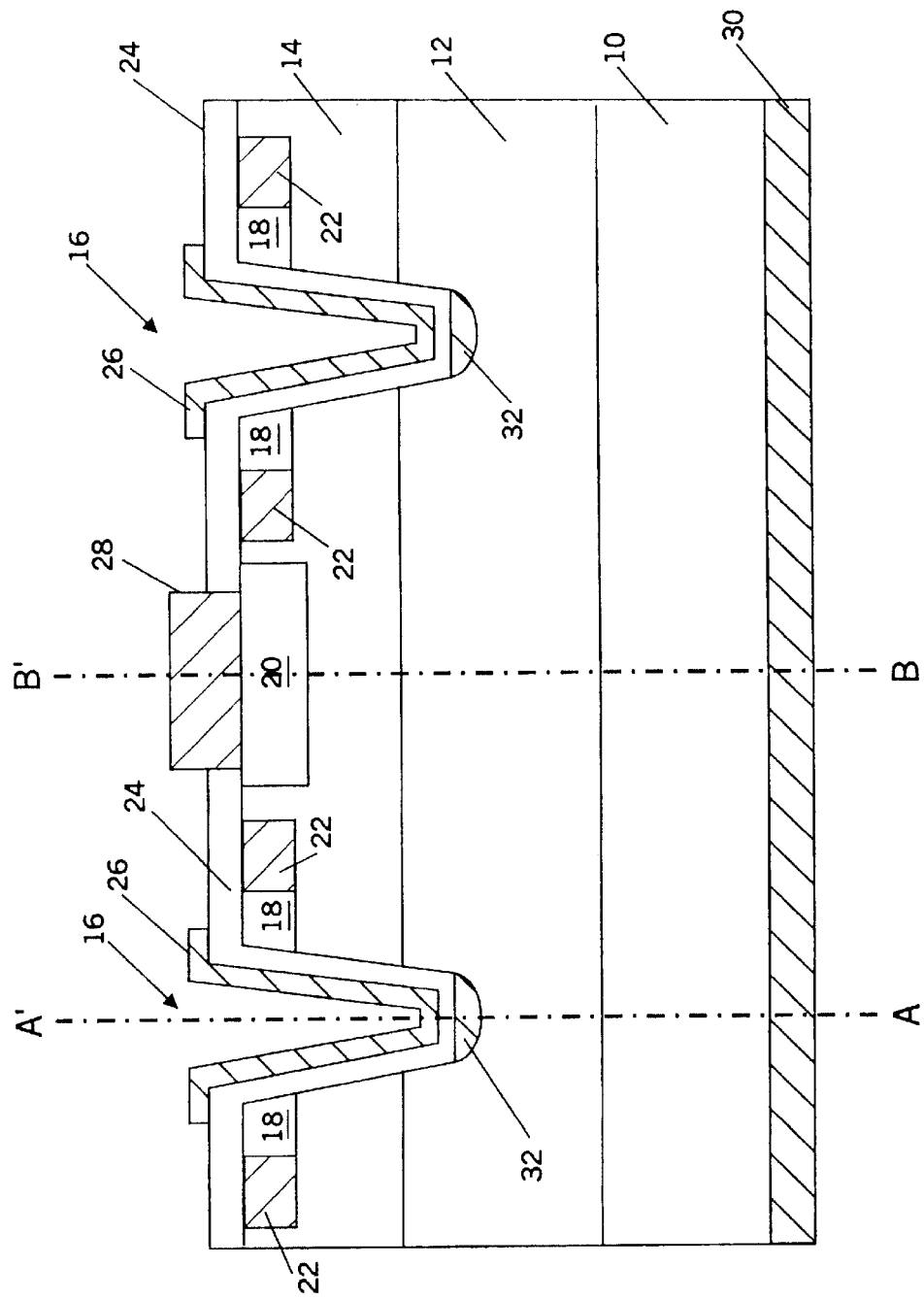
FIG. 2 is a cross sectional view of a plurality of unit cells of a power device according to the present invention.

FIG. 2 illustrates one embodiment of the present invention. As seen in FIG. 2, a combination of unit cells of a latch-up free power UMOS bipolar transistor (LMBT) are illustrated. A unit cell of the first embodiment the present invention is illustrated between the lines A–A' and B–B' of FIG. 2. By mirroring this unit cell around both the A–A' line and the B–B' line devices of multiple unit cells may be produced. FIG. 2 illustrates a portion of a multiple unit cell device. As will be appreciated by those of skill in the art, the unit cell of the present invention may also be utilized to make a single unit cell device. In such a case the regions 18 and 22 need only be produced on the emitter side of the trench 16.

The LMBT of the present invention includes a bulk single crystal silicon carbide substrate 10 of n-type conductivity silicon carbide. The substrate 10 has an upper surface and a lower surface opposite the upper surface. A first layer 12 of n-type conductivity silicon carbide may be formed on the upper surface of the substrate 10 to form an n⁻ drift region. Alternatively, an n⁻ substrate could have an n⁺ region implanted in the lower surface of the substrate so as to provide n⁺ and n⁻ regions in the substrate. Thus, as used herein references to the substrate and first layer refer to layers formed both on the substrate and in the substrate. The carrier concentration of the substrate 10 is higher than the carrier concentration of the first layer 12. Thus, the substrate may be referred to as an n⁺ substrate. Sheet resistivities of less than 1 Ω-cm may be suitable for the substrate 10. Carrier concentrations of from about $10^{12}$ cm$^{-3}$ to about $10^{17}$ cm$^{-3}$ may be suitable for the first layer 12. The substrate may have a thickness of from about 100 μm to about 500 μm. The first layer 12 may have a thickness of from about 3 μm to about 500 μm.

Formed on the first layer 12 is a second layer 14 to provide a p-type base layer. The second layer 14 may be epitaxially grown or implanted in the first layer 12 and is formed of p-type conductivity silicon carbide which forms a p-type base layer for the device. Formed in the second layer 14 is region 20 of n⁺ conductivity silicon carbide which forms the emitter of the device. Also formed in the second layer 14 are n⁺ regions 18 and p⁺ regions 22. The p⁺ silicon carbide regions 22 are preferably formed adjacent n⁺ regions 18 such that a conductive p-n tunnel junction is formed between n⁺ regions 18 and p⁺ regions 22. The n⁺ regions 18 are formed such that they form a portion of the sidewall of the gate trench 16. The n⁺ regions 18 form the drain region of a MOS transistor incorporated into the present device.

The p-type base layer 14 preferably has a carrier concentration of from about $10^{16}$ cm$^{-3}$ to about $10^{18}$ cm$^{-3}$ and a thickness of from about 0.3 μm to about 5 μm. The n⁺ regions 18 preferably extend between from about 0.5 μm to about 2 μm away from the gate trench 16 and extend to a depth of from about 0.1 μm to about 2 μm. Carrier concentrations of greater than about $10^{18}$ cm$^{-3}$ maybe suitable for the n⁺ regions 18. Similarly, the p⁺ regions 22 are preferably formed to a depth of from about 0.1 μm to about 2 μm and have a width of from about 0.1 μm to about 2 μm. Carrier concentrations of greater than about $10^{16}$ cm$^{-3}$ are suitable for the p⁺ regions 22. The p-type regions 22 are also preferably separated from the emitter region 20 by from about 0.5 μm to about 4 μm. The size and shape of the emitter region may be dependent on the desired characteristics of the bipolar portion of the present device.

The device illustrated in FIG. 2 also includes a gate trench 16. The gate trench 16 is formed by forming a trench which extends downward through n⁺ regions 18 and the second layer 14 and into the first layer 12. Thus the gate trench 16 has sidewalls and a bottom. An insulator layer 24, preferably an oxide layer, is formed on the sidewalls and bottom of the gate trench and extends onto the upper surface of the n⁺ regions 18. This insulator layer 24 is preferably an oxide layer such as silicon dioxide, but may also be made of other materials such as silicon nitride, aluminum nitride or other insulator materials known to those of skill in the art. The width and depth of the gate trench 16 is dependent upon the desired electrical properties of the device. Widths of from about 1 μm to about 10 μm may be utilized for the present invention. The depth of the gate trench should be sufficiently deep such that the upper surface of the insulator/oxide layer 24 formed on the bottom of the gate trench 16 is below the interface between the second layer 14 and the first layer 12. Furthermore, the thickness of the gate insulator 24 is preferably from about 100 Å to about 1 μm, but may vary depending on the desired electrical properties of the transistor.

The device of FIG. 2 also includes an optional region of p-type conductivity silicon carbide 32 formed in the first layer 12 below the gate trench 16. This region of p-type conductivity silicon carbide 32 has a higher carrier concentration than the second layer 12. Carrier concentrations of from about $10^{16}$ cm$^{-3}$ to about $10^{19}$ cm$^{-3}$ may be utilized.

An ohmic contact is formed on the lower surface of the substrate 10 to create a collector contact 30. A contact is also formed on the sidewalls and bottom of the gate trench 16 and extends onto the upper surface of the n⁺ regions 18. This contact provides a gate contact for the device of FIG. 2.

Finally, an ohmic contact 28 is formed on the n⁺ silicon carbide region 20 to provide an emitter contact for the device.

The gate trench 16 is illustrated as two trenches in FIG. 2. However, as will be appreciated by those of skill in the art, the gate trench may have many differing shapes in the third dimension (the dimension into and out of the page in FIG. 2). Thus, for example, the device illustrated in FIG. 2 may be a substantially circular device where the gate trenches 16 are a single gate trench which substantially surrounds the emitter region 20 as, for example, in a hexagonal shaped device. Also, the gate trenches 16 may be two substantially parallel trenches where the gate contacts 26 formed in the gate trenches 16 are electrically connected in the third dimension. Thus, the three dimensional configuration of the devices according to the present invention may take many differing forms while still benefiting from the teachings of the present invention.

Figure 3:
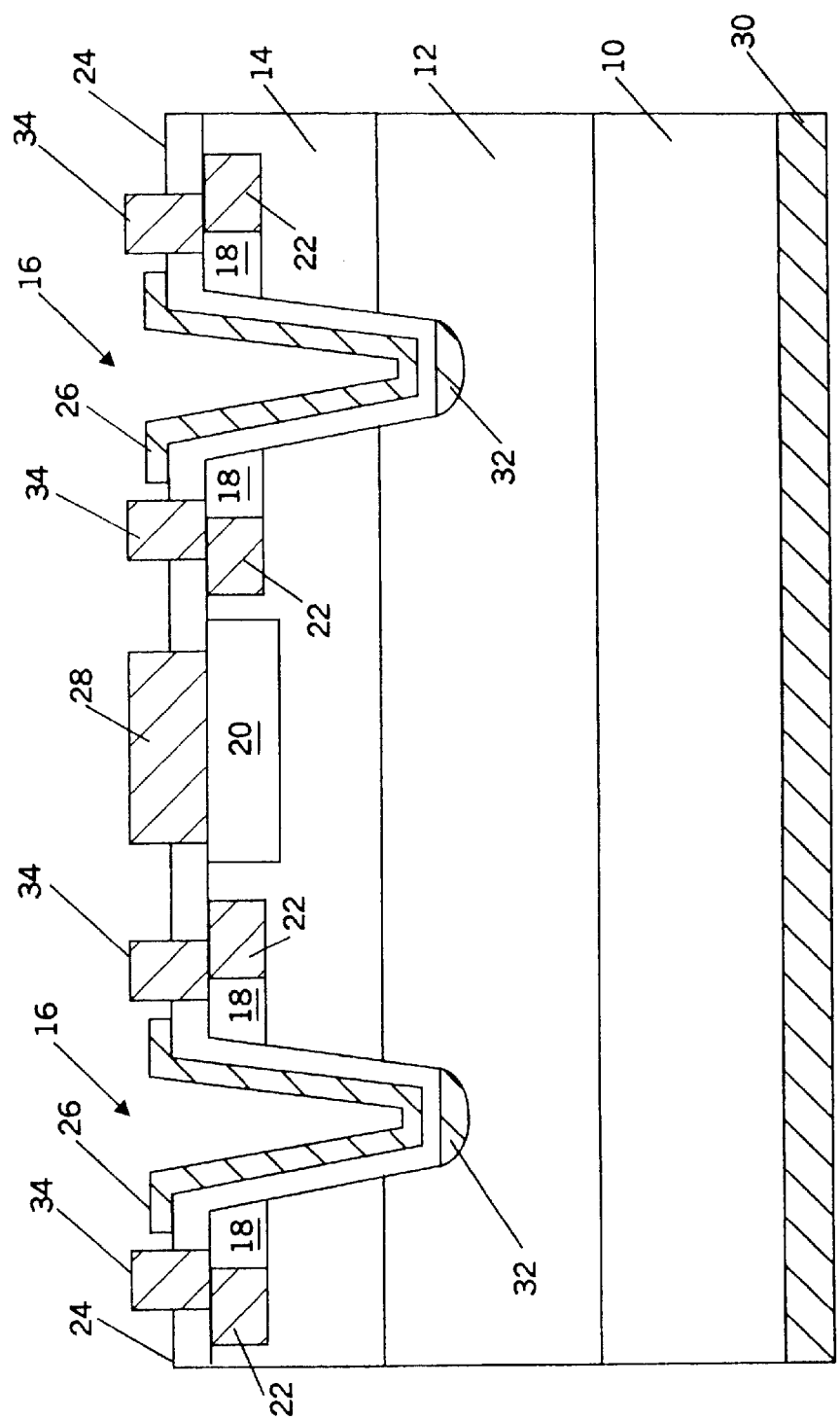
FIG. 3 is a cross sectional view of an alternative embodiment of a plurality of unit cells of a power device according to the present invention.

FIG. 3 illustrates an alternative embodiment of the present invention. As seen in FIG. 3, the structure of the device of FIG. 2 also has a conductive strap 34 connecting the n⁺ region 18 to the p⁺ region 22. In the device illustrated in FIG. 3, there should not be a rectifying p-n junction formed between n⁺ region 18 and p⁺ region 22. As will be appreciated by those of skill in the art, the unit cell illustrated in FIG. 2 is also present in FIG. 3. hus, a device comprising any number of unit cells may be produced according to the teachings of the present invention.

As will be appreciated by those of skill in the art, the present invention may form the unit cell for a power device such that a plurality of the cells of the device may be formed and operated in parallel to increase the current carrying capabilities of the device. In such a case the unit cell of the device illustrated in FIG. 2 or FIG. 3 may be replicated in a symmetrical fashion to produce multiple devices. In such a device the outer gate trenches which are at the periphery of the device need only have the n-type and p-type regions on the emitter side of the gate trench.

Figure 4A:
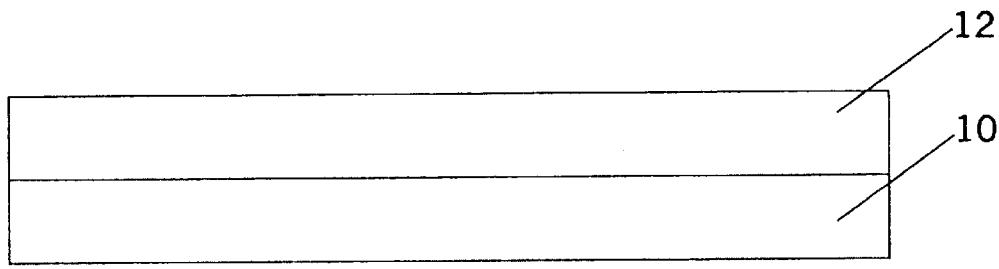
Figure 4B:
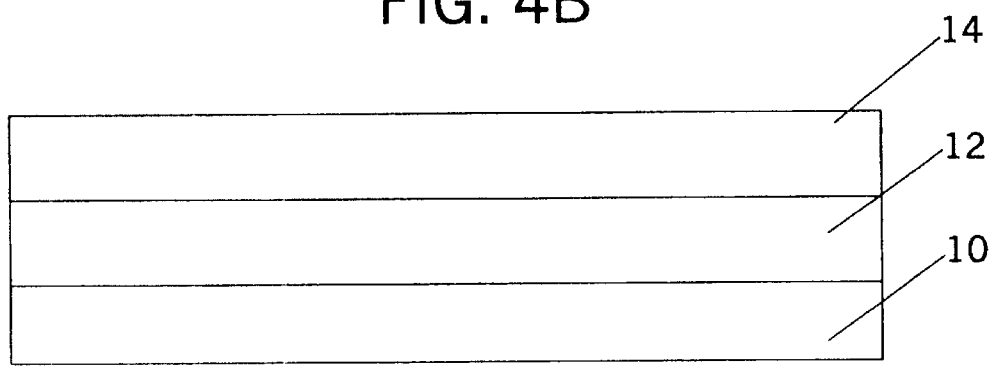
Figure 4C:
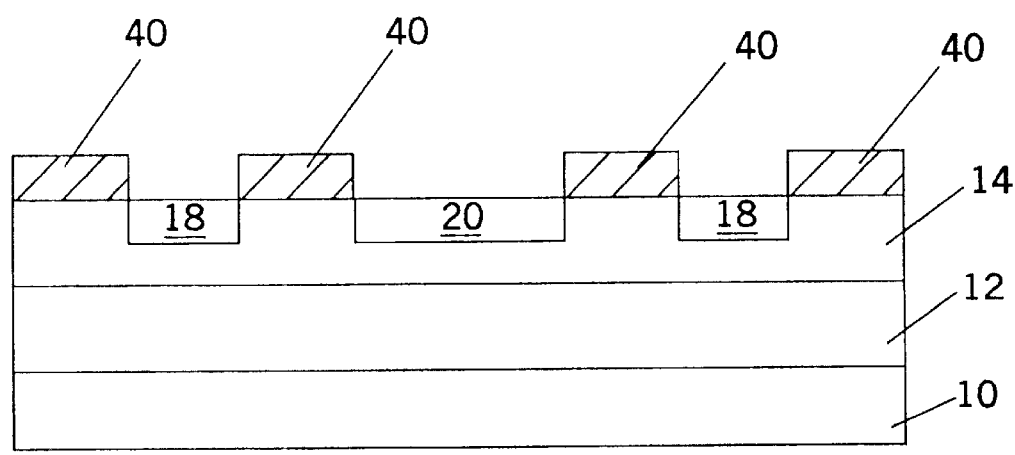

Fabrication of the devices described above with respect to FIGS. 2 and 3 will now be described with reference to FIG. 4A through FIG. 4J. In fabricating the device of FIG. 2, as illustrated in FIG. 4A, a thick n-type layer 12 is grown on the n⁺ substrate 10 utilizing an epitaxial growth process such as that described in the U.S. Pat. No. 4,912,064, the disclosure of which is incorporated herein by reference as if set forth fully. As discussed above, alternatively, an n⁻ substrate may be utilized and an n⁺ implant performed to provide the n⁺ layer 10 and n⁻ layer 12. As illustrated in FIG. 4B, a second p-type layer 14 is epitaxially grown on the first n-type epitaxial layer 12. The n⁺ regions 18 and 20 are then formed on the p-type layer 14. These n⁺ regions 18 and 20 may be formed by ion implantation using a mask 40 as illustrated in FIG. 4C.

Figure 4D:
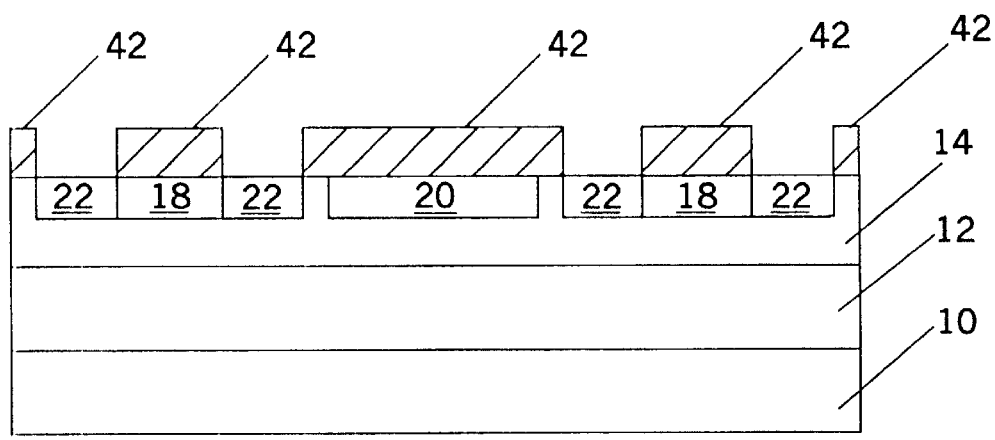

As is illustrated in FIG. 4D, the p-type regions 22 may be formed by ion implantation utilizing a mask 42. The mask 42 is preferably formed so as to position the p-type regions 22 adjacent the n-type regions 18 so as to form a conductive p-n tunnel junction between these regions. After formation of the p-type regions 22 and the n-type regions 18 and 20, the structure is annealed at a temperature greater than about 1500° C. to activate the implanted ions.

After annealing, the device may be edge terminated by etching a mesa surrounding the device. The mesa (not shown) may extend through the second layer 14 and the first layer 12 and into the substrate 10. Alternatively, the mesa may extend through the second layer 14 and into the first layer 12. In such a case, ions may be implanted in the exposed n⁻ layer 12 to a depth of from about 100 Å to about 5 $\mu$m and to a distance of from about 5 $\mu$m to about 500 $\mu$m from the edge of the mesa. Carrier concentrations of from about $5 \times 10^{15}$ cm⁻³ to about $1 \times 10^{17}$ cm⁻³ may be utilized to form a low doped p-type region surrounding the mesa. In either case a passivation layer may then be formed on the exposed surfaces of the mesa (not shown). Such a passivation layer may be $SiO_2$ or other such suitable materials known to those of skill in the art.

Figure 4E:
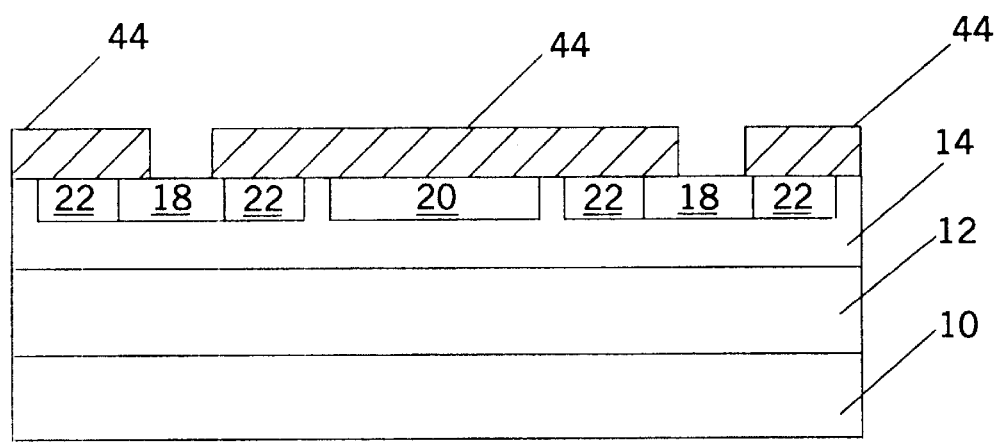

After creation of the epitaxial structure, a mask 44 is formed on the structure to position the gate trench of the device. Such a mask is illustrated in FIG. 4E. The gate trench 16 is formed by reactive ion etching through the p-type base layer 14 into the n-type drift layer 12. The gate trench 16 may be etched utilizing the reactive ion etching techniques described in U.S. Pat. No. 4,981,551, the disclosure of which is incorporated herein by reference as if set forth fully.

Figure 4F:
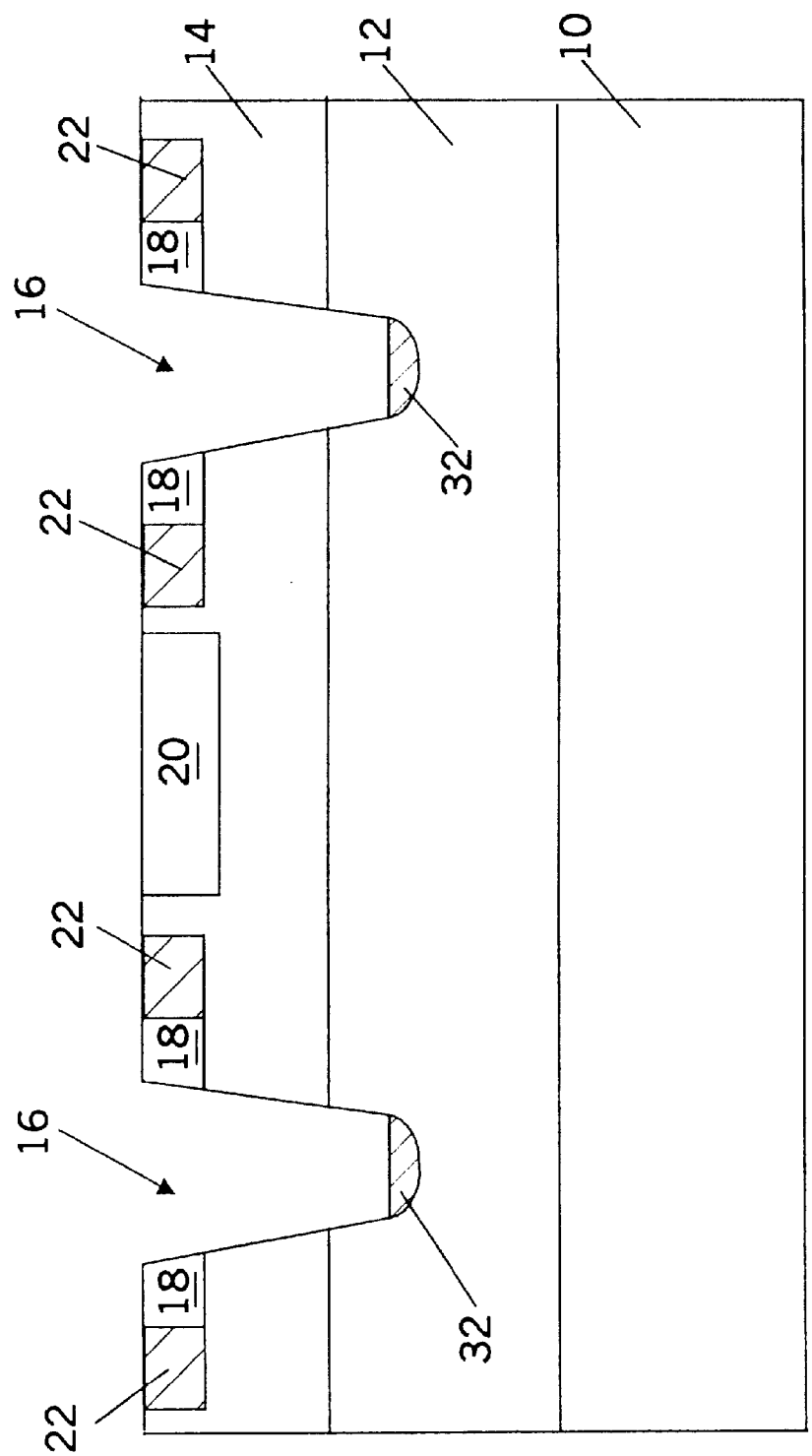

As seen in FIG. 4F, a p-type region 32 may optionally be ion implanted at the bottom of the gate trench 16. This p-type region 32 at the bottom of the trench 16 may reduce field crowding at the corner of the gate trench and, thereby, increase breakdown voltage of the MOS portion of the device. This p⁺ implanted region 32 may be formed by a method such as those described in U.S. Pat. No. 5,087,576, the disclosure of which is incorporated herein by reference as if set forth fully.

After formation of the gate trench 16, an insulator/oxide layer 26 is formed on the epitaxial structure as illustrated in FIG. 4G. The insulator layer 24 is formed so as to cover the bottom and sidewalls of the trench 16 and extend onto the upper surface of the n⁺ regions 18. The insulator/oxide layer 24 preferably utilizes either a thermal oxidation process such as that described in commonly assigned U.S. patent application Ser. No. 08/554,319 entitled "Process For Reducing Defects In Oxide Layers In Silicon Carbide", the disclosure of which is incorporated herein by reference as if set forth fully, or a deposited oxide process such as that described in U.S. Pat. No. 5,459,107 and U.S. patent application Ser. No. 08/554,319, the disclosures of which are incorporated herein by reference as if set forth fully. If the thermal oxidation process is used then the preferred embodiment is to use carbon faced wafers such as described in U.S. Pat. No. 5,506,421, the disclosure of which is incorporated herein by reference as if set forth fully.

Figure 4H:
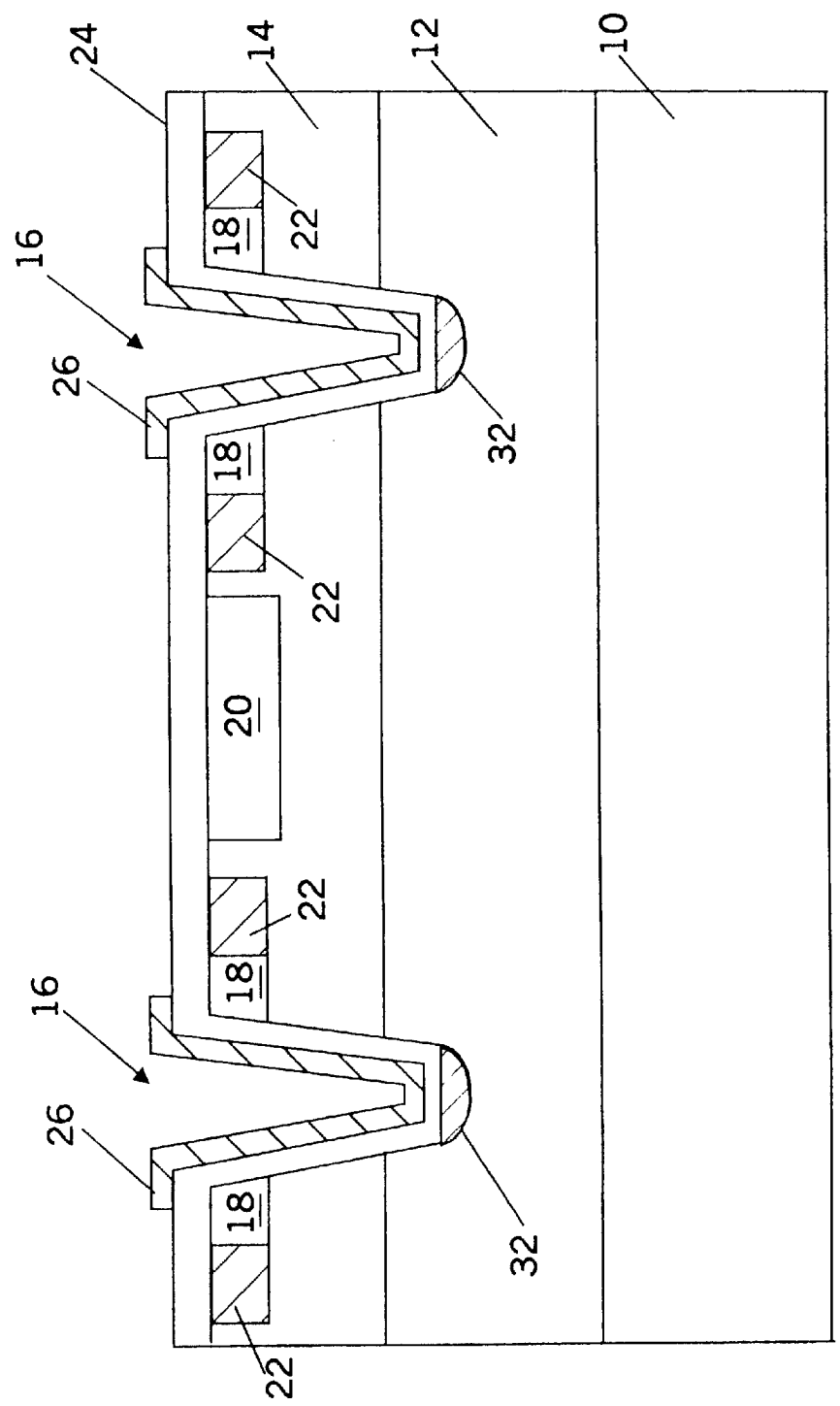
Figure 41:
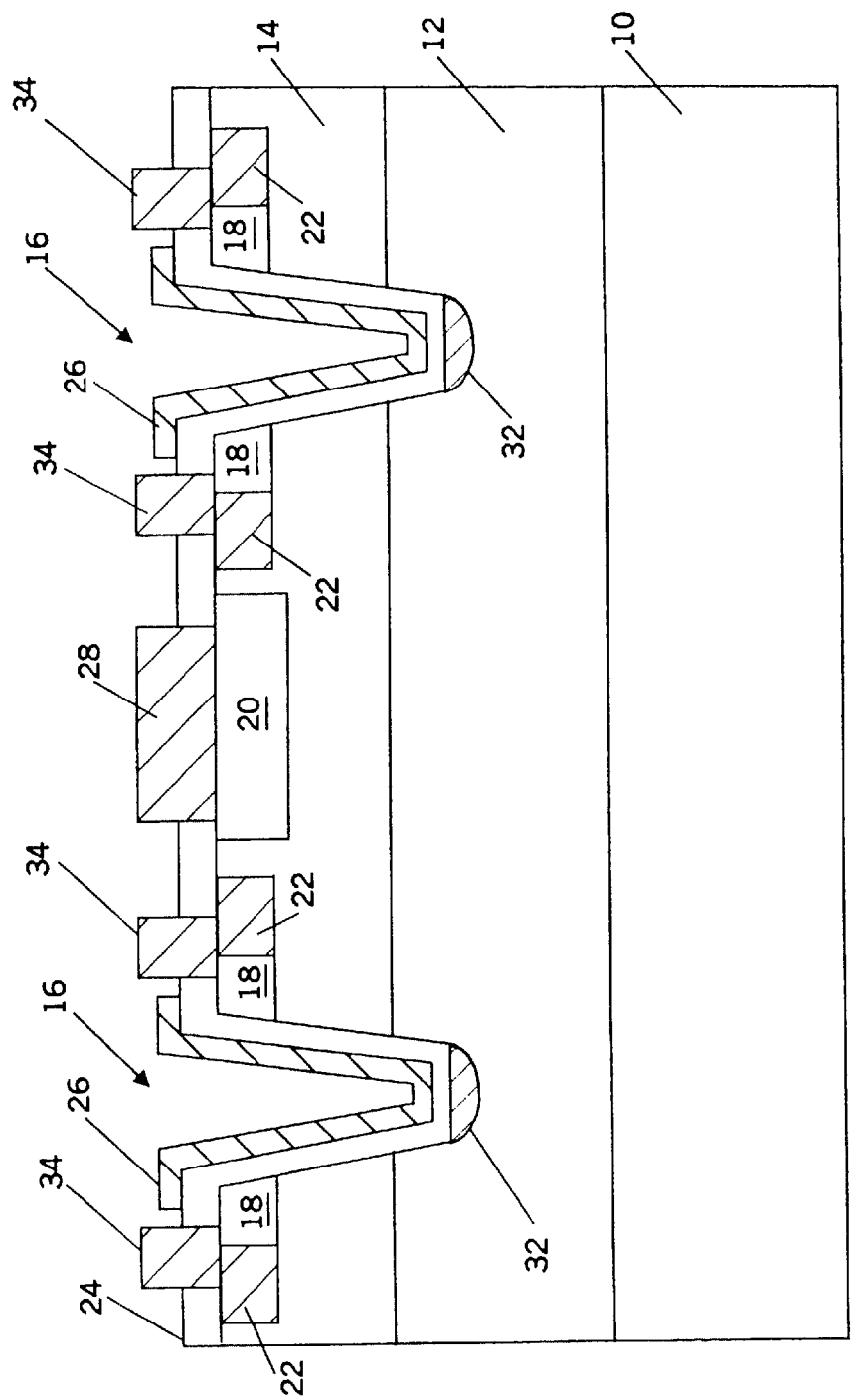
Figure 4J:
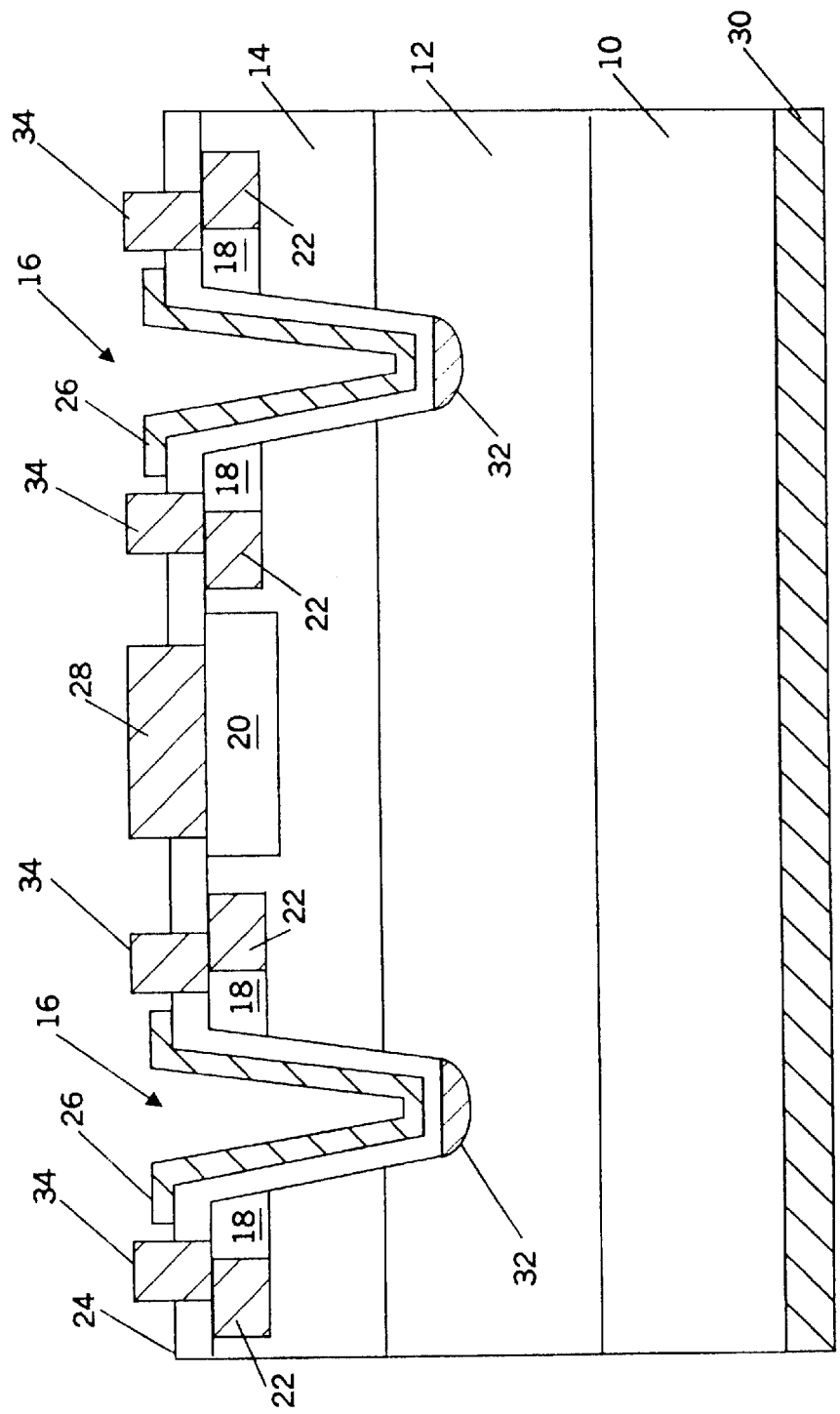

The formation of contacts for the present device is illustrated in FIGS. 4H through 4J. The gate contact may be formed by depositing a conducting layer in the gate trench 16 as illustrated in FIG. 4H. As illustrated in FIG. 4H the gate material 26, preferably molybdenum, may be deposited on the insulating layer 24 and patterned so as to extend above a portion of the n-type region 18. As seen in FIG. 4I, the emitter contact 28 and the optional conductive strap 34 may be formed simultaneously by forming openings in the insulating layer 24 and then depositing nickel or other suitable contact materials on the exposed portion of layer 14. Finally, as illustrated in FIG. 4J, a collector contact 30 is formed on the exposed side of the substrate by deposition of nickel or other suitable contact material.

In each of the embodiments described above, the substrate and layers may be formed of silicon carbide selected from the group of 6H, 4H, 15R, or 3C silicon carbide, however, 4H silicon carbide is preferred for each of the devices described above. The preferred metals for ohmic contacts include nickel, tantalum silicide and platinum. Additionally, aluminum/titanium contacts may also be used to form the ohmic contacts of the present invention. While these particular metals have been described, any other metals known to those of skill in the art which form ohmic contacts with silicon carbide may be used.

With regard to the carrier concentrations or doping levels of the epitaxial layers and implanted regions of the devices described above, the $p^+$ or $n^+$ conductivity type regions and epitaxial layers should be as heavily doped as possible without causing excessive fabrication defects. Suitable dopants for producing the p-type regions include aluminum, boron or gallium. Suitable dopants for producing the n-type regions include nitrogen and phosphorus. Aluminum is the preferred dopant for the $p^+$ regions and it is preferred that the aluminum be implanted in the $p^+$ regions using high temperature ion implantation such as is described above and employing temperatures of between about 1000° C. and about 1500° C. Carrier concentrations of up to about $3 \times 10^{17}$ $cm^{-3}$ are suitable for the n epitaxial layers, however, carrier concentrations of about $3 \times 10^{16}$ $cm^{-3}$ or less are preferred.

As will be appreciated by those of skill in the art, the thickness of epitaxial layers 12 and 14 will be dependent upon the desired operating characteristics of the device. Furthermore, these operating characteristics will be affected by the number of unit cells employed and the geometry of the unit cells in a multiple cell device. The width of the gate trench will also be dependent upon the desired operating characteristics of the device, the number of unit cells employed to achieve those operating characteristics, and the geometry utilized for the unit cell itself.

In operation, the device of the present invention provides a silicon carbide device which combines bipolar conduction with MOS gated control. Furthermore, the present invention utilizes an n-type silicon carbide substrate which allows for referencing the gate voltage to the emitter of the device. This relationship allows for referencing the gate voltage to ground in a power circuit. Another advantage of the present invention is that n channel conduction through the MOS transistor is utilized for base current injection which reduces the impact of lower electron channel mobility in silicon carbide.

Turn on of devices according to the present invention is accomplished by the application of a positive bias on the collector 30 (about 3–10 V) and a positive bias on the gate 26 (about 15–40 V) while the emitter 28 is kept at ground potential. The source of the NMOSFET 18 is floating during the off state and is at approximately 3 V (the silicon carbide forward bias voltage drop for a p-n junction) above the emitter voltage in operation. A positive bias on the gate 26 enables the turn-on of the nMOSFET. The gate voltage ($V_g$) for turn-on of the device will then be $15V + V_t + 3V$, where $V_t$ is the threshold voltage for the MOS device. Positively biasing the gate with respect to the source allows a path for the flow of electrons from the collector to the base of the npn transistor thereby forward biasing its emitter-base junction. The device achieves a high current density operation by the injection of minority carriers into the low doped drift region by the turn-on of the npn transistor. Hence, this device achieves a high current density with relatively low forward voltage drop. The base current to the npn transistor is limited by the saturation current of the MOS transistor which in turn results in current saturation characteristics of the LMBT. Higher gate voltage allows for higher base current into the npn transistor and hence a higher saturation current of the LMBT.

The device enters the forward blocking mode of operation when the gate potential is made the same as the emitter potential. This turns off the NMOSFET which reduces the base current of the npn transistor to zero. After the minority carriers of the npn transistor decay with their characteristic lifetime, the device stops carrying current and can support substantial collector voltage. This voltage is supported by the p-base 14 to $n^-$ drift region 12 junction and the $p^+$ buffer/gate oxide-$n^-$ drift region junction. The $p^+$ buffer region 32 may optionally be shorted to the p-base in the third dimension. The purpose of this buffer is to prevent high electric fields in the gate dielectric in the forward blocking mode of operation of the device.

Figure 5:
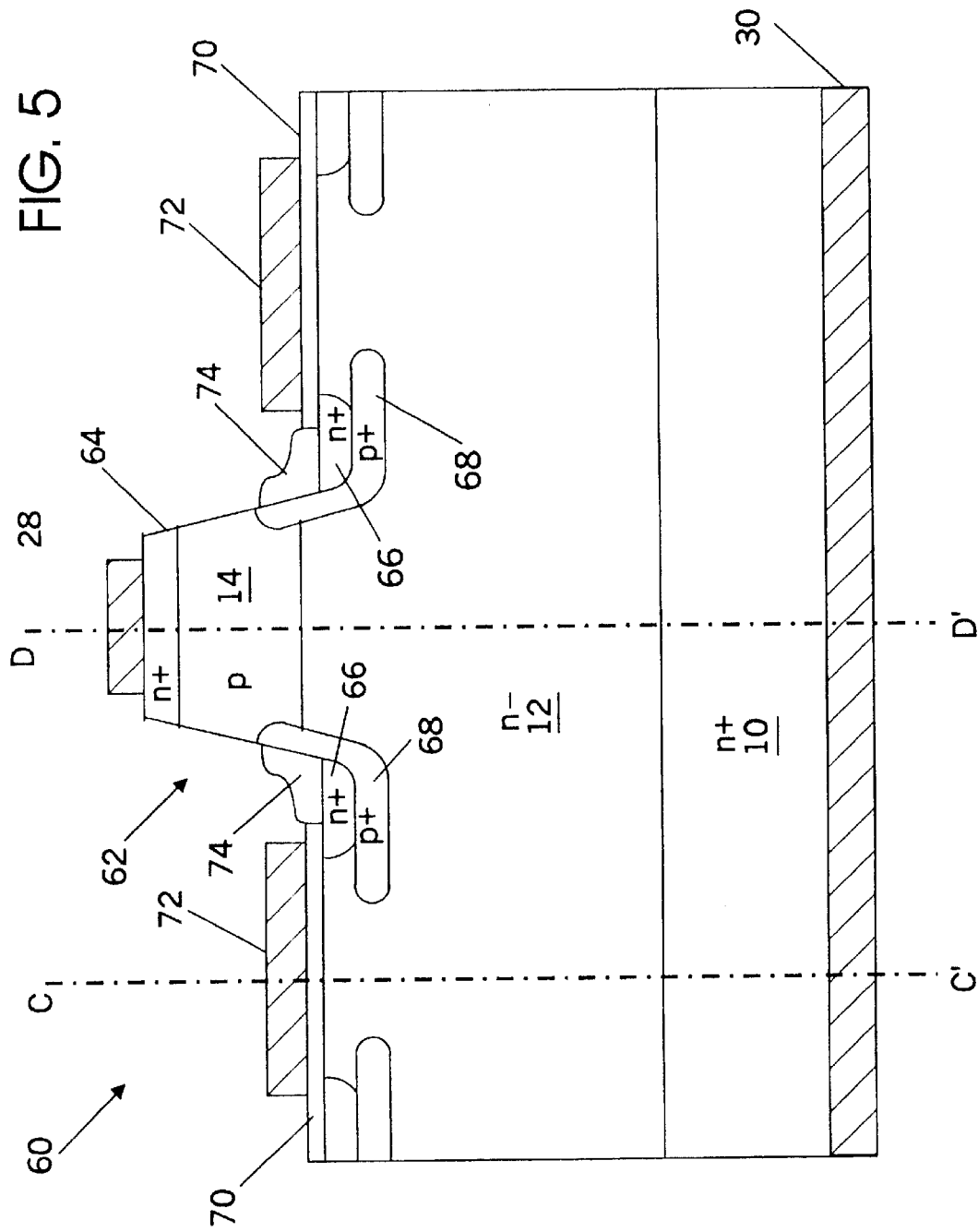
FIG. 5 is a cross sectional view of a plurality of unit cells of a power device according to an alternative embodiment of the present invention.

FIG. 5 illustrates an alternative embodiment of the present invention which utilizes an epitaxially formed p-type conductivity base region of the bipolar transistor and a buried p-type silicon carbide region to control the electric field presented to the gate insulator/oxide. As seen in FIG. 5, a combination of unit cells of a latch-up free power MOS bipolar transistor 60 are illustrated. A unit cell of the alternative embodiment the present invention is illustrated between the lines C–C', and D–D' of FIG. 5. By mirroring this unit cell around both the C–C' line and the D–D' line devices of multiple unit cells may be produced. FIG. 5 illustrates a portion of a multiple unit cell device. As will be appreciated by those of skill in the art, the unit cell of the present invention may also be utilized to make a single unit cell device.

As is seen in FIG. 5, the MOS-Bipolar transistor 60 of the alternative embodiment of the present invention includes a bulk single crystal silicon carbide substrate 10 of n-type conductivity silicon carbide. The substrate 10 has an upper surface and a lower surface opposite the upper surface. A first layer 12 of n-type conductivity silicon carbide may be formed on the upper surface of the substrate 10 to form an $n^-$ drift region. Alternatively, an $n^-$ substrate could have an $n^+$ region implanted in the lower surface of the substrate so as to provide $n^+$ and $n^-$ regions in the substrate. Thus, as used herein references to the substrate and first layer refer to layers formed both on the substrate and in the substrate. The carrier concentration of the substrate 10 is higher than the carrier concentration of the first layer 12. Thus, the substrate may be referred to as an $n^+$ substrate. Sheet resistivities of less than 1 Ω-cm may be suitable for the substrate 10. Carrier concentrations of from about $10^{12}$ $cm^{-3}$ to about $10^{17}$ $cm^{-3}$ may be suitable for the first layer 12. The substrate may have a thickness of from about 100 μm to about 500 μm. The first layer 12 may have a thickness of from about 3 μm to about 500 μm.

Formed on the first layer 12 is a second layer 14 to provide a p-type base layer. The second layer 14 is preferably epitaxially grown and is formed of p-type conductivity silicon carbide which forms a p-type base layer for the device. As is illustrated in FIG. 5, the epitaxial layer 14 is patterned so as to form a mesa having a sidewall 62 which extends into the $n^-$ layer 12. The sidewall 62 preferably extends into layer 12 as little as possible but depths of about 0.5 μm may be acceptable. Preferably the sidewall of the mesa is sloped such that the base of the mesa is wider than the top of the mesa. This slope is preferably less than 60 degrees as measured by the angle the sidewall makes with the drift layer 12. Preferably the difference between the width of the top of mesa 62 and the width of the base of mesa 62 is less than about 10 μm. However, this distance may vary depending on the thickness of the p-type base layer 14 and the first region of n-type silicon carbide 64 so as to achieve the desired slope of the sidewall of the mesa 62. The slope of the sidewall is preferably selected so as to cooperate with the implantation of atoms such that the profile of the p-type region 68 is formed. The slope facilitates implantation of the p-type regions 68 by allowing implantation of the p-type atoms such that the p-type region 68 extends to contact the p base layer 14. Thus, the slope of the mesa should be selected so as to provide a continuous region of implanted atoms which extend from the drift layer 12 to the base layer 14.

The MOS-bipolar transistor of the embodiment of the present invention illustrated in FIG. 5 also includes a first region of n-type silicon carbide 64 formed on the p-type base layer 14 adjacent a surface opposite the n-type silicon carbide drift layer 12 to provide an emitter region for the bipolar transistor of the MOS-bipolar transistor 60. This first region of n-type silicon carbide 64 is preferably doped to have a higher carrier concentration than the n-type conductivity layer 12 so as to provide a first region 64 of $n^+$ silicon carbide. An ohmic contact is also formed on the first region of n-type silicon carbide 64 so as to provide an emitter contact 28.

An insulating layer 70 is formed on the first layer 12 adjacent to and disposed from the sidewall of the mesa 62. An ohmic contact is formed on the insulating layer 70 to provide a gate contact 72 for the MOS transistor. This insulator layer 70 is preferably an oxide layer such as silicon dioxide, but may also be made of other materials such as silicon nitride, aluminum nitride or other insulator materials known to those of skill in the art.

The MOS-bipolar transistor 60 also includes a second region of $n^+$ silicon carbide 66 formed in the $n^-$ drift layer 12 at the base of the sidewall of mesa 62. The $n^+$ region 66 extends from the sidewall of the mesa 62 to beneath a gate contact 72 of the device. The second region of $n^+$ silicon carbide 66 preferably is doped to provide a carrier concentration of greater than the $n^-$ drift layer 12. The second region of $n^+$ silicon carbide 66 also preferably is formed adjacent the surface of the drift layer 12 so as to allow for contact between the second region of $n^+$ silicon carbide 66 and conductive strap 74.

A p-type region of silicon carbide 68 is also formed in the p-type base layer 14 adjacent a sidewall of mesa 62 and the second region of $n^+$ silicon carbide 66. The p-type region of silicon carbide 68 also extends in the n-type drift layer 12 below the second region of $n^+$ silicon carbide 66 and extends below the gate contact 72. The p-type region of silicon carbide 68 is preferably doped to provide a carrier concentration greater than the carrier concentration of the p-type base layer 14. Furthermore, the p-type region of silicon carbide is formed so as to convert electrons flowing through the second region of $n^+$ silicon carbide 66 into holes for injection in the p-type base layer. The p-type region of silicon carbide 68 is also formed so as to reduce the field crowding associated with the gate insulator 70 to thereby increase the blocking voltage of the MOS transistor portion of the MOS-bipolar transistor 60.

The MOS-bipolar transistor 60 also includes a conductive strap 74 which electrically connects the second region of $n^+$ silicon carbide 66 with the p-type region of silicon carbide 68. Alternatively, the need for a conductive strap 74 may be eliminated if the p-n junction between the second region of $n^+$ silicon carbide 66 and the p-type region of silicon carbide 68 forms a tunnel diode to thereby convert electron flow to hole flow in the base layer 14.

The p-type base layer 14 preferably has a carrier concentration of from about $10^{16}$ cm$^{-3}$ to about $10^{18}$ cm$^{-3}$ and a thickness of from about 0.3 µm to about 5 µm. The second $n^+$ regions 66 are preferably from about 1 µm to about 5 µm wide and extend under the gate as little as possible but this distance may range from about 0.5 µm to about 3 µm. The second $n^+$ regions 66 also preferably extend to a depth of from about 0.1 µm to about 0.5 µm. Carrier concentrations of greater than about $10^{18}$ cm$^{-3}$ maybe suitable for the $n^+$ regions 66.

The $p^+$ regions 68 are preferably of a thickness of from about 0.3 µm to about 2 µm and extend beneath the gate contact 72 from about 3 µm to about 12 µm. However, the distance which the $p^+$ regions 68 extend beneath the gate contact may vary depending on the particular application. In particular, the space between $p^+$ regions 68 beneath a gate contact may be utilized to adjust the electric field near the insulating layer 70. As the space between $p^+$ regions 68 decreases the electric field near the insulating layer 70 may be reduced. Spacings of from about 1 µm to about 5 µm may be suitable. Carrier concentrations of greater than about $10^{16}$ cm$^{-3}$ are suitable for the $p^+$ region 68. Preferably the doping of the drift layer 12 and $p^+$ region 68 are selected such that the drift layer 12 is completely depleted by the built-in potentials of the $p^+/n$ junction and the MOS gate at a zero gate bias.

Figure 6:
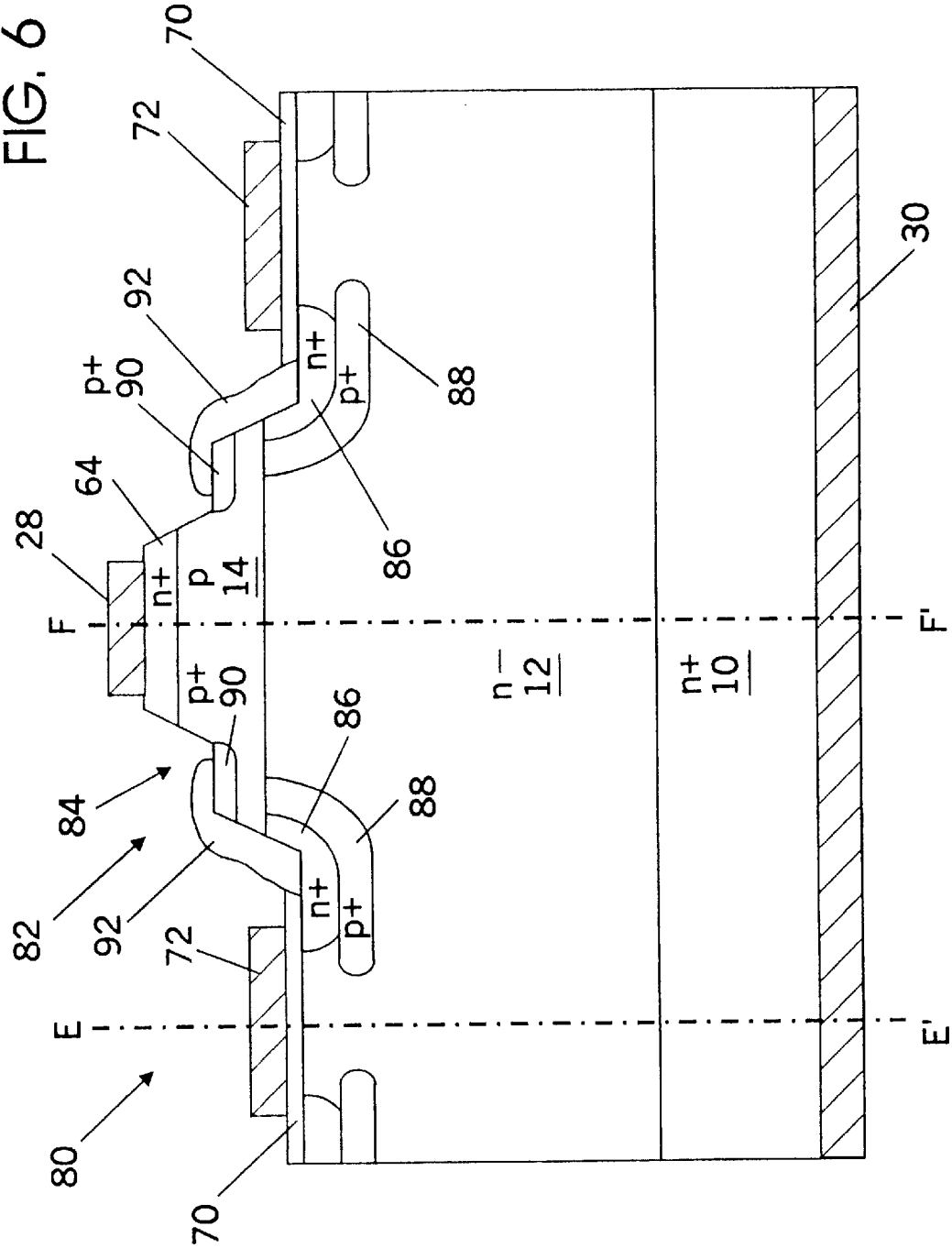
FIG. 6 is a cross-sectional view of a plurality of unit cells of a power device according to a second alternative embodiment of the present invention.

FIG. 6 illustrates a second alternative embodiment of the present invention which utilizes an epitaxially formed p-type conductivity base region of the bipolar transistor where the base region is formed as a mesa having a step in the sidewall of the mesa. As seen in FIG. 6, a combination of unit cells of a latch-up free power MOS bipolar transistor 80 are illustrated. A unit cell of the alternative embodiment of the present invention is illustrated between the lines E–E' and F–F' of FIG. 6. By mirroring this unit cell around both the E–E' line and the F–F' line devices of multiple unit cells may be produced. FIG. 6 illustrates a portion of a multiple unit cell device. As will be appreciated by those of skill in the art, the unit cell of the present invention may also be utilized to make a single unit cell device.

As is seen in FIG. 6, the MOS-Bipolar transistor 80 of the alternative embodiment of the present invention includes a bulk single crystal silicon carbide substrate 10 of n-type conductivity silicon carbide and a first layer 12 of n-type conductivity silicon carbide as is described with respect to FIG. 5.

Formed on the first layer 12 is a second layer 14 to provide a p-type base layer. The second layer 14 is preferably epitaxially grown and is formed of p-type conductivity silicon carbide and forms a p-type base layer for the device. As is illustrated in FIG. 6, the epitaxial layer 14 is patterned so as to form a mesa 82 having a sidewall which forms a step 84 and which extends to $n^-$ layer 12. The sidewall 82 preferably extends into layer 12 as little as possible but depths of about 0.5 µm may be acceptable. Preferably the sidewall of the mesa 82 which extends from the step 84 to the drift layer 12 is sloped such that the base of the mesa is wider than the width of the mesa at the step 84. This slope is preferably less than 60 degrees as measured by the angle the sidewall makes with the drift layer 12. Preferably the difference between the width of the top of mesa 82 and the width of the base of mesa 82 is less than about 10 µm. However, this distance may vary depending on the thickness of the p-type base layer 14 and the first region of n-type silicon carbide 64 so as to achieve the desired slope of the sidewall of the mesa 82. Furthermore, the slope of the sidewall from the step portion 84 to the drift layer 12 is preferably selected so to cooperate with the implantation of atoms such that the profile of the p-type region 88 is formed. The slope facilitates implantation of the p-type regions 88 by allowing implantation of the p-type atoms such that the p-type region 88 extends to contact the p base layer 14. Thus, the slope of the mesa should be selected so as to provide a continuous region of implanted atoms which extend from the drift layer 12 to the base layer 14.

The MOS-bipolar transistor of the embodiment of the present invention illustrated in FIG. 6 also includes a first region of n-type silicon carbide 64 formed on the p-type base layer 14 adjacent a surface opposite the n-type silicon carbide drift layer 12 to provide an emitter region for the bipolar transistor of the MOS-bipolar transistor 80. This first region of n-type silicon carbide 64 is preferably doped to have a higher carrier concentration than the n-type conductivity layer 12 so as to provide a first region 64 of n+ silicon carbide. An ohmic contact is also formed on the first region of n-type silicon carbide 64 so as to provide an emitter contact 28.

An insulating layer 70 is formed on the first layer 12 adjacent to and disposed from the sidewall of the mesa 82. An ohmic contact is formed on the insulating layer 70 to provide a gate contact 72 for the MOS transistor. This insulator layer 70 is preferably an oxide layer such as silicon dioxide, but may also be made of other materials such as silicon nitride, aluminum nitride or other insulator materials known to those of skill in the art.

The MOS-bipolar transistor 80 also includes a second region of n+ silicon carbide 86 formed in the n− drift layer 12 at the base of the sidewall of mesa 82 and extends from the sidewall to beneath a gate contact 72 of the device. The second region of n+ silicon carbide 86 preferably is doped to provide a carrier concentration of greater than the n− drift layer 12. The second region of n+ silicon carbide 86 also preferably is formed adjacent the surface of the drift layer 12 so as to allow for contact between the second region of n+ silicon carbide 86 and conductive strap 92.

Regions of p-type silicon carbide 88 and 90 are also formed in the p-type base layer 14 adjacent second region of n+ silicon carbide 86 and in the p-type base layer 14 at the step 84 in the mesa 82. The p-type region of silicon carbide 88 extends into the n− type drift layer 12 below the second region of n+ silicon carbide 86 below the gate contact 72. The p-type regions of silicon carbide 88 and 90 are preferably doped to provide a carrier concentration greater than the carrier concentration of the p-type base layer 14. Furthermore, the p-type region of silicon carbide 90 is formed so as to convert electrons flowing through the second region of n+ silicon carbide 86 into holes for injection in the p-type base layer. The p-type region of silicon carbide 88 is formed so as to reduce the field crowding associated with the gate insulator 70 to thereby increase the blocking voltage of the MOS transistor portion of the MOS-bipolar transistor 80. The MOS-bipolar transistor 80 also includes a conductive strap 74 which electrically connects the second region of n+ silicon carbide 86 with the p-type region of silicon carbide 90. The conductive strap 74 may also connect the second region of n+ silicon carbide 86 with the p-type base layer 14 so as to place the p-type region 88 at the same potential as the second region of n+ silicon carbide 86.

The p-type base layer 14 preferably has a carrier concentration of from about $10^{16}$ cm$^{-3}$ to about $10^{16}$ cm$^{-3}$ and a thickness of from about 0.3 $\mu$m to about 5 $\mu$m. The second n+ regions 86 are preferably from about 1 $\mu$m to about 5 $\mu$m wide and extend under the gate as little as possible but this distance may range from about 0.5 $\mu$m to about 3 $\mu$m. The second n+ regions 86 also preferably extend to a depth of from about 0.1 $\mu$m to about 0.5 $\mu$m. Carrier concentrations of greater than about $10^{18}$ cm$^{-3}$ maybe suitable for the n+ regions 86.

The p+ regions 88 and 90 are preferably of a thickness of from about 0.3 $\mu$m to about 2 $\mu$m with region 88 extending beneath the gate contact 72 from about 3 $\mu$m to about 12 $\mu$m. However, the distance which the p+ region 88 extends beneath the gate contact may vary depending on the particular application. In particular, the space between p+ regions 88 beneath a gate contact may be utilized to adjust the electric field near the insulating layer 70. As the space between p+ regions 88 decreases the electric field near the insulating layer 70 may be reduced. Spacings of from about 1 $\mu$m to about 5 $\mu$m may be suitable. Carrier concentrations of greater than about $10^{16}$ cm$^{-3}$ are suitable for the p+ region 88 and 90. Preferably the doping of the drift layer 12 and p+ region 88 is selected such that the drift layer 12 is completely depleted by the built-in potentials of the p+/n junction and the MOS gate at a zero gate bias.

FIG. 7 illustrates a third alternative embodiment of the present invention which utilizes an epitaxially formed p-type conductivity base region of the bipolar transistor where the base region is formed as a mesa having a step in the sidewall of the mesa similar to that of FIG. 6. As seen in FIG. 7, a combination of unit cells of a latch-up free power MOS bipolar transistor 200 are illustrated. A unit cell of the alternative embodiment of the present invention is illustrated between the lines G–G' and H–H' of FIG. 7. By mirroring this unit cell around both the G–G' line and the H–H' line devices of multiple unit cells may be produced. FIG. 7 illustrates a portion of a multiple unit cell device. As will be appreciated by those of skill in the art, the unit cell of the present invention may also be utilized to make a single unit cell device.

As is seen in FIG. 7, the MOS-Bipolar transistor 200 of the alternative embodiment of the present invention includes a bulk single crystal silicon carbide substrate 10 of n-type conductivity silicon carbide and a first layer 12 of n-type conductivity silicon carbide as is described with respect to FIGS. 5 and 6.

Formed on the first layer 12 is a second layer 14 to provide a p-type base layer. The second layer 14 is preferably epitaxially grown and is formed of p-type conductivity silicon carbide and forms a p-type base layer for the device. As is illustrated in FIG. 7, the epitaxial layer 14 is patterned so as to form a mesa 282 having a sidewall which forms a step 284 and which extends to n− layer 12. The sidewall of mesa 282 preferably extends into layer 12 as little as possible but depths of about 0.5 $\mu$m may be acceptable. While the sidewall of the mesa 282 which extends from the step 284 to the drift layer 12 is illustrated as sloped such that the base of the mesa is wider than the width of the mesa at the step 284. However, such a slope is not required by the embodiment of the present invention illustrated in FIG. 7.

The MOS-bipolar transistor of the embodiment of the present invention illustrated in FIG. 7 also includes a first region of n-type silicon carbide 64 formed on the p-type base layer 14 adjacent a surface opposite the n-type silicon carbide drift layer 12 to provide an emitter region for the bipolar transistor of the MOS-bipolar transistor 200. This first region of n-type silicon carbide 64 is preferably doped to have a higher carrier concentration than the n-type conductivity layer 12 so as to provide a first region 64 of n+ silicon carbide. An ohmic contact is also formed on the first region of n-type silicon carbide 64 so as to provide an emitter contact 28.

An insulating layer 70 is formed on the first layer 12 adjacent to and disposed from the sidewall of the mesa 82. An ohmic contact is formed on the insulating layer 70 to provide a gate contact 72 for the MOS transistor. This insulator layer 70 is preferably an oxide layer such as silicon dioxide, but may also be made of other materials such as silicon nitride, aluminum nitride or other insulator materials known to those of skill in the art.

The MOS-bipolar transistor 200 also includes a second region of n⁺ silicon carbide 206 formed in the n⁻ drift layer 12 at the base of the sidewall of mesa 282 and extends from the sidewall to beneath a gate contact 72 of the device. The second region of n⁺ silicon carbide 206 preferably is doped to provide a carrier concentration of greater than the n⁻ drift layer 12. The second region of n⁺ silicon carbide 206 also preferably is formed adjacent the surface of the drift layer 12 so as to allow for contact between the second region of n⁺ silicon carbide 206 and conductive strap 92.

Regions of p-type silicon carbide 208 and 90 are also formed in the p-type base layer 14 adjacent second region of n⁺ silicon carbide 206 and in the p-type base layer 14 at the step 284 in the mesa 282. The p-type region of silicon carbide 208 extends into the n⁻type drift layer 12 below the second region of n⁺ silicon carbide 206 and below the gate contact 72. The p-type regions of silicon carbide 208 and 90 are preferably doped to provide a carrier concentration greater than the carrier concentration of the p-type base layer 14. Furthermore, the p-type region of silicon carbide 90 is formed so as to convert electrons flowing through the second region of n⁺ silicon carbide 206 into holes for injection in the p-type base layer. The p-type region of silicon carbide 208 is formed so as to reduce the field crowding associated with the gate insulator 70 to thereby increase the blocking voltage of the MOS transistor portion of the MOS-bipolar transistor 200.

The MOS-bipolar transistor 200 also includes a conductive strap 92 which electrically connects the second region of n⁺ silicon carbide 206 with the p-type region of silicon carbide 90. The conductive strap 92 is preferably formed on an insulating layer 210 which is formed on the sidewall of the mesa 282 and extending to the step portion 284 of the mesa 282. This insulating layer 210 may be an oxide layer. The conductive strap 74 may also connect the second region of n⁺ silicon carbide 206 with the p-type region 208 so that the p-type region 208 is at the same potential as the second region of n⁺ silicon carbide 206. As is illustrated in FIG. 7, the p-type region 208 preferably extends to the exposed surface of the drift layer 12 so that contact may be made between the p-type region 208, the n-type region 206 and the p-type region 90. Thus, the p-type region 208 may be formed so that it is exposed in a region near the base of the mesa 282 and need not extend under the mesa 282. So as to reduced the amount of area required by the device, the distance that the p-type region 208 extends past the base of the mesa 282 is preferably kept to a minimum size which allows for the connections described above.

The p-type base layer 14 preferably has a carrier concentration of from about $10^{16}$ cm⁻³ to about $10^{18}$ cm⁻³ and a thickness of from about 0.3 μm to about 5 μm. The second n⁺ regions 206 are preferably from about 1 μm to about 5 μm wide and extend under the gate as little as possible but this distance may range from about 0.5 μm to about 3 μm. The second n⁺ regions 206 also preferably extend to a depth of from about 0.1 μm to about 0.5 μm. Carrier concentrations of greater than about $10^{18}$ cm⁻³ maybe suitable for the n⁺ regions 206.

The p⁺ regions 208 and 90 are preferably of a thickness of from about 0.3 μm to about 2 μm with region 208 extending beneath the gate contact 72 from about 3 μm to about 12 μm. However, the distance which the p⁺ region 208 extends beneath the gate contact may vary depending on the particular application. In particular, the space between p⁺ regions 208 beneath a gate contact may be utilized to adjust the electric field near the insulating layer 70. As the space between p+ regions 208 decreases the electric field near the insulating layer 70 may be reduced. Spacings of from about 1 μm to about 5 μm may be suitable. Carrier concentrations of greater than about $10^{16}$ cm⁻³ are suitable for the p⁺ region 208 and 90. Preferably the doping of the drift layer 12 and p⁺ region 208 is selected such that the drift layer 12 is completely depleted by the built-in potentials of the p+/n junction and the MOS gate at a zero gate bias.

The operation of the embodiments of FIG. 5, FIG. 6 or FIG. 7 is similar to the devices described above with respect to FIGS. 2 and 3. Both devices provide a silicon carbide device which combines bipolar conduction with MOS gated control. Furthermore, these alternative embodiments also utilize an n-type silicon carbide substrate which allows for referencing the gate voltage to the emitter of the device. These devices also have increased breakdown voltages as the p-type implanted regions in the drift layer serve to reduce the electric field presented to the gate insulator of the MOS device. Furthermore, because the MOS devices of the alternative embodiments are accumulation mode devices, the electron accumulation layer mobility of silicon carbide may be exploited. Thus, electron accumulation layer mobilities of about 20 times that the inversion layer carrier mobilities may be achieved. This may provide lower on-state voltage drop in the MOS device.

Turn on of the devices according to the present invention is accomplished by the application of a positive bias on the collector 30 (about 3–10 V) and a positive bias on the gate 72 (about 15–40 V) while the emitter 28 is kept at ground potential. The source of the NMOSFET 66, 86 and 206 is floating during the off state and is at approximately 3 V (the silicon carbide forward bias voltage drop for a p-n junction) above the emitter voltage in operation. A positive bias on the gate 72 enables the turn-on of the nMOSFET. The gate voltage ($V_g$) for turn-on of the device will then be 15V+$V_t$+3V, where $V_t$ is the threshold voltage for the MOS device. Positively biasing the gate with respect to the source allows a path for the flow of electrons from the collector to the base of the npn transistor thereby forward biasing its emitter-base junction. The device achieves a high current density operation by the injection of minority carriers into the low doped drift region by the turn-on of the npn transistor. Hence, this device achieves a high current density with relatively low forward voltage drop. The base current to the npn transistor is limited by the saturation current of the MOS transistor which in turn results in current saturation characteristics of the LMBT. Higher gate voltage allows for higher base current into the npn transistor and hence a higher saturation current of the LMBT.

The device enters the forward blocking mode of operation when the gate potential is made the same as the emitter potential. This turns off the NMOSFET which reduces the base current of the npn transistor to zero. After the minority carriers of the npn transistor decay with their characteristic lifetime, the device stops carrying current and can support substantial collector voltage. This voltage is supported by the p-base 14 to n⁻ drift region 12 junction and the p⁺ buffer/gate oxide-n⁻ drift region junction. The p⁺ regions 68, 88 and 208 prevent high electric fields in the gate dielectric in the forward blocking mode of operation of the device.

The fabrication process of the device of FIG. 6 is illustrated in FIGS. 7A through 7H. As will be appreciated by those of skill in the art in light of the discussion herein, the fabrication process for the device of FIG. 5 is similar to the fabrication process for the device of FIG. 6 with the primary difference being the formation of the mesa and corresponding implantations. Furthermore, the fabrication process for the device of FIG. 7 is also similar with the primary difference being the masking location for the n-type and p-type regions.

Figure 8A:
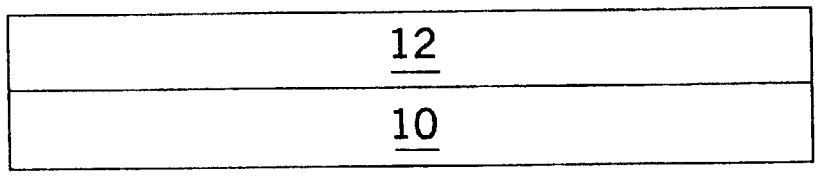
Figure 8B:
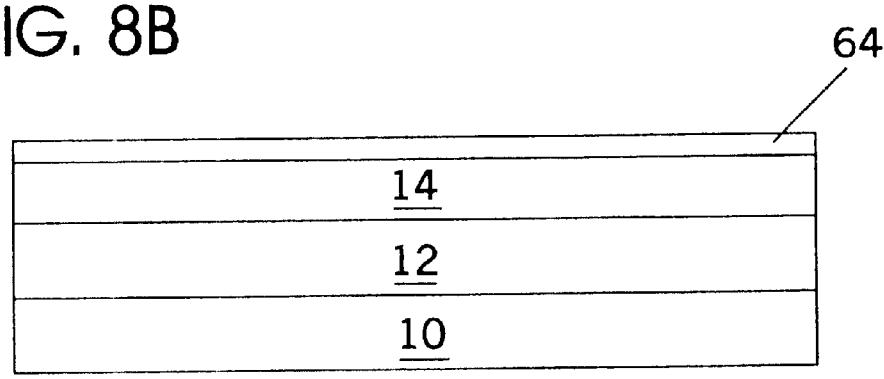

In fabricating the devices of FIGS. 5, 6 and 7, as illustrated in FIG. 8A, a thick n-type layer 12 is grown on the n⁺ substrate 10 utilizing an epitaxial growth process such as that described in the U.S. Pat. No. 4,912,064, the disclosure of which is incorporated herein by reference as if set forth fully. As discussed above, alternatively, an n⁻ substrate may be utilized and an n⁺ implant performed to provide the n⁺ layer 10 and n⁻ layer 12. As illustrated in FIG. 8B, a second p-type layer 14 is epitaxially grown on the first n-type epitaxially layer 12. The n⁺ region 64 is then formed on the p-type layer 14. The n⁺ region 64 may be formed by ion implantation or by epitaxial growth.

Figure 8C:
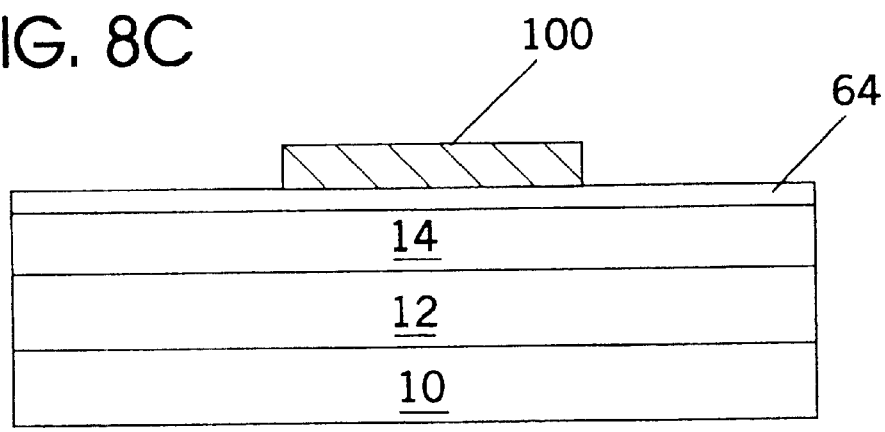

FIG. 8C illustrates the first step in forming a mesa where a mask 100 is formed on the n-type region 64. The mask 100 is formed to a width corresponding to the widest dimension of the upper portion of the mesa 82. The n-type region 64, p-type layer 14 and the mask 100 are then etched to form the upper portion of mesa 82. The mask 100 preferably is formed of a material which etches at a rate similar to the rate of etching of the silicon carbide regions. Thus, a sloped sidewall is formed as the mask 100 etches back to expose portions of the silicon carbide. As will be appreciated by those of skill in the art, the mask 100 may be formed of a photoresist which is then selectively heated so as to achieve the desired resistance to etching. Thus, for example, if the mask 100 etches at the same rate as the silicon carbide, then a sloped sidewall of about 45 degrees will be formed. The sloped sidewalls may be etched utilizing the reactive ion etching techniques described in U.S. Pat. No. 4,981,551, the disclosure of which is incorporated herein by reference as if set forth fully.

Figure 8D:
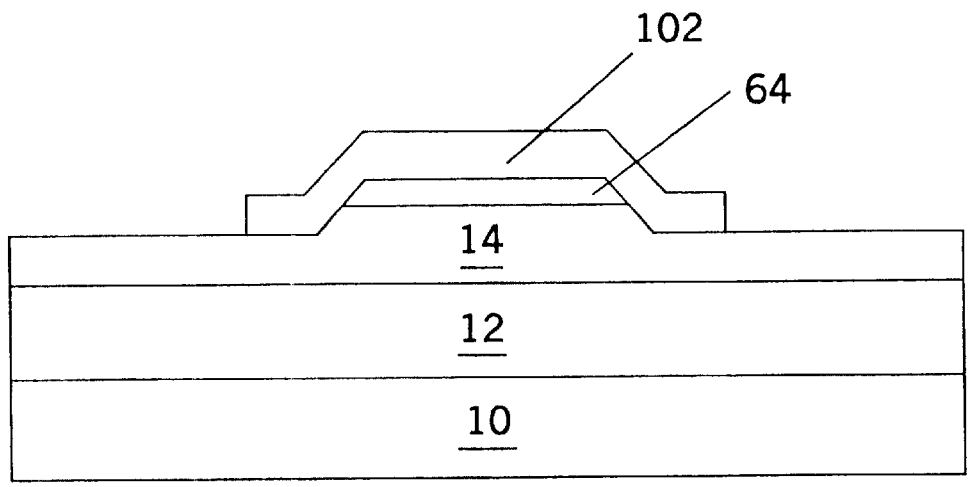

FIG. 8D illustrates the formation of a second mask 102 which is formed on the first mesa which results from etching the masked region of FIG. 8C. As with the mask 100 of FIG. 8C, the mask 102 of FIG. 8D is sized so as to define the maximum width of the base of the mesa 82 and to provide the step portion 84. The structure of FIG. 8D is then etched such that the mesa 82 is completed where the etching process etches the mask 102 and etches through p-type layer 14 to the drift layer 12. As with mask 100, mask 102 may be a photoresist wherein the rate at which the photoresist etches in relation to the rate that silicon carbide is controlled so as to provide a sloped sidewall to the mesa 82.

Figure 8E:
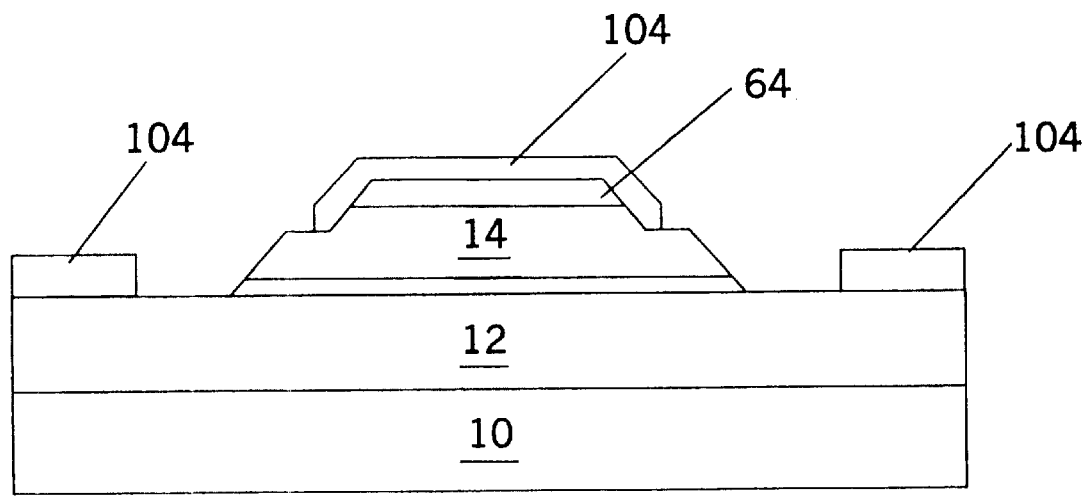

As is illustrated in FIG. 8E, the p-type regions 88 and 90 may be formed by ion implantation utilizing a third mask 104. The mask 104 is preferably formed so as to position the p-type region 88 beneath the gate of the device and so that the p-type region 88 extends to the p-type layer 14. The mask 104 is also preferably formed so as to position the p-type region 90 at the step portion 84 of the mesa 82. The p⁺ implanted regions 88 and 90 may be formed by a method such as those described in U.S. Pat. No. 5,087,576, the disclosure of which is incorporated herein by reference as if set forth fully.

After formation of the p-type regions 88 and 90, as is seen in FIG. 8F, the mask 104 is removed and a fourth mask 106 is formed for formation of the n-type regions 86. Mask 106 is preferably formed so as to position the n-type regions 86 to extend from the p-type region to the gate of the device. The n-type regions 86 are then formed by ion implantation using the mask 106. After formation of the n-type regions 86 and the p-type regions 88 and 90, the structure is annealed, preferably at a temperature greater than about 1500° C. to activate the implanted ions.

After annealing, the device may be edge terminated by etching an isolation mesa surrounding the device. The isolation mesa (not shown) may extend through the second layer 14 and the first layer 12 and into the substrate 10. Alternatively, the isolation mesa may extend through the second layer 14 and into the first layer 12. In such a case, ions may be implanted in the exposed n⁻ layer 12 to a depth of from about 100 Å to about 5 μm and to a distance of from about 5 μm to about 500 μm from the edge of the isolation mesa. Carrier concentrations of from about $5 \times 10^{15}$ cm⁻³ to about $1 \times 10^{17}$ cm⁻³ may be utilized to form a low doped p-type region surrounding the isolation mesa.

Figure 8G:
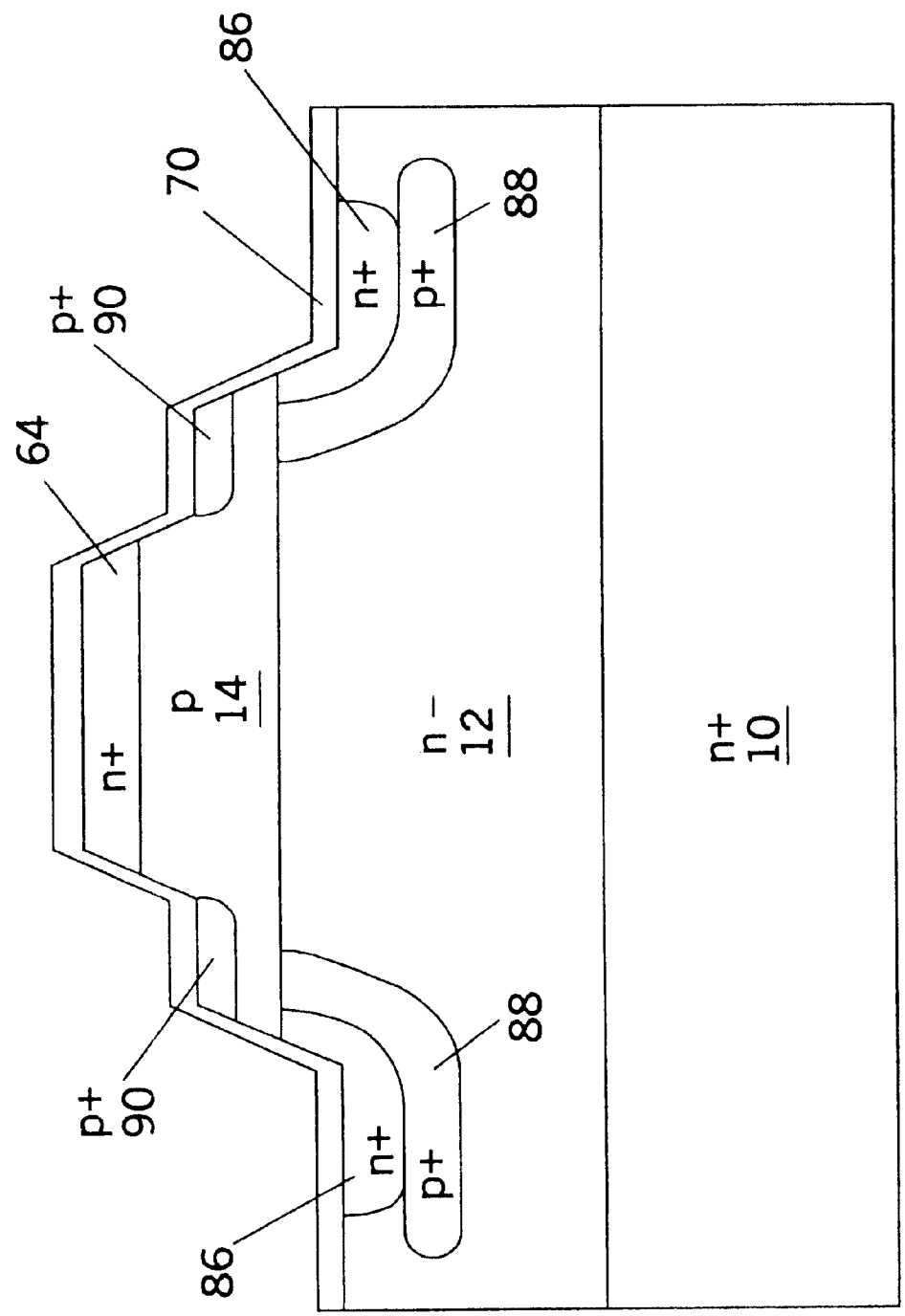

After formation of the mesa 82 and the n-type and p-type regions 86, 88 and 90, an insulator/oxide layer 70 is formed on the epitaxial structure as illustrated in FIG. 8G. The insulator/oxide layer 70 preferably utilizes either a thermal oxidation process such as that described in commonly assigned U.S. patent application Ser. No. 08/554,319 entitled "Process For Reducing Defects In Oxide Layers In Silicon Carbide", the disclosure of which is incorporated herein by reference as if set forth fully, or a deposited oxide process such as that described in U.S. Pat. No. 5,459,107 and U.S. patent application Ser. No. 08/554,319, the disclosures of which are incorporated herein by reference as if set forth fully. If the thermal oxidation process is used then the preferred embodiment is to use carbon faced wafers such as described in U.S. Pat. No. 5,506,421, the disclosure of which is incorporated herein by reference as if set forth fully.

After formation of the insulator/oxide layer 70, the layer is then etched to provide openings for the formation of the conductive strap 92, gate contact 72 and emitter contact 28. The formation of contacts for the present device is illustrated in FIG. 8H. The gate contact may be formed by depositing a conducting layer on the insulator/oxide layer 70 and then patterning this conductive layer. As illustrated in FIG. 8H the gate material 72, preferably molybdenum, may be deposited on the insulating layer 70 and patterned so as to extend above a portion of the n-type region 86. The emitter contact 28 and the optional conductive strap 34 may be formed simultaneously by forming openings in the insulating layer 70 and then depositing nickel or other suitable contact materials on the exposed portions of layers 14 and 12. Finally, a collector contact 30 is formed on the exposed side of the substrate by deposition of nickel or other suitable contact material.

In each of the embodiments described above with respect to FIGS. 5 through 8H, the substrate and layers may be formed of silicon carbide selected from the group of 6H, 4H, 15R, or 3C silicon carbide, however, 4H silicon carbide is preferred for each of the devices described above. The preferred metals for ohmic contacts include nickel, tantalum silicide and platinum. Additionally, aluminum/titanium contacts may also be used to form the ohmic contacts of the present invention. While these particular metals have been described, any other metals known to those of skill in the art which form ohmic contacts with silicon carbide may be used.

With regard to the carrier concentrations or doping levels of the epitaxial layers and implanted regions of the devices described above, the p⁺ or n⁺ conductivity type regions and epitaxial layers should be as heavily doped as possible without causing excessive fabrication defects. Suitable dopants for producing the p-type regions include aluminum, boron or gallium. Suitable dopants for producing the n-type regions include nitrogen and phosphorus. Aluminum is the preferred dopant for the p+ regions and it is preferred that the aluminum be implanted in the p+ regions using high temperature ion implantation such as is described above and employing temperatures of between about 1000° C. and about 1500° C. and preferably greater than about 1500° C. Carrier concentrations of up to about $3\times10^{17}$ cm$^{-+}$ are suitable for the n epitaxial layers, however, carrier concentrations of about $3\times10^{16}$ cm$^{-3}$ or less are preferred.

As will be appreciated by those of skill in the art, the thickness of epitaxial layers 12 and 14 will be dependent upon the desired operating characteristics of the device. Furthermore, these operating characteristics will be affected by the number of unit cells employed and the geometry of the unit cells in a multiple cell device. The width of the gate will also be dependent upon the desired operating characteristics of the device, the number of unit cells employed to achieve those operating characteristics, and the geometry utilized for the unit cell itself.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A MOS bipolar transistor comprising:
   a silicon carbide npn bipolar transistor on a bulk single crystal n-type silicon carbide substrate and having an n-type drift layer and an epitaxial p-type base layer formed as a mesa on said n-type drift layer;
   a silicon carbide nMOSFET in said n-type drift layer including spaced apart n-type source and drain regions with a gate region therebetween and adjacent said npn bipolar transistor so as to provide base current to said npn bipolar transistor when said bipolar transistor is in a conductive state;
   means for converting electron current flowing between said source and said drain into hole current for injection into said p-type base layer; and
   means for reducing field crowding associated with an insulating layer of said nMOSFET.

2. A MOS bipolar transistor according to claim 1 wherein said means for converting comprises:
   a region of p-type conductivity silicon carbide in said p-type base layer and having a higher carrier concentration than said p-type base layer; and
   an electrically conductive strap for electrically connecting the n-type source region of said nMOSFET to said region of p-type conductivity silicon carbide.

3. A MOS bipolar transistor according to claim 1, wherein said means for reducing field crowing comprises a region of p-type conductivity silicon carbide formed in said drift layer beneath and spaced apart from said insulating layer and extending to said base layer.

4. A MOS bipolar transistor according to claim 1, wherein sidewalls of said mesa includes a step portion and wherein said means for converting comprises:
   a region of p-type conductivity silicon carbide in said p-type base layer at said step portion having a higher carrier concentration than said p-type base layer; and
   an electrically conductive strap for electrically connecting the n-type source region of said nMOSFET to said region of p-type conductivity silicon carbide.

5. A MOS bipolar transistor according to claim 1, wherein said mesa has sloped sidewalls wherein the slope of the sidewalls provides a predefined doping profile associated with said means for reducing field crowding.

6. A MOS bipolar transistor according to claim 1, wherein said nMOSFET is an accumulation mode nMOSFET.

7. A unit cell of a MOS bipolar transistor comprising:
   an n-type bulk single crystal silicon carbide substrate;
   an n-type silicon carbide drift layer adjacent said n-type conductivity bulk single crystal silicon carbide substrate, said n-type drift layer having a carrier concentration of less than said n-type silicon carbide substrate;
   a p-type epitaxial silicon carbide base layer formed on said n-type silicon carbide drift layer;
   a first n-type region of silicon carbide formed in said p-type base layer adjacent a surface opposite said n-type silicon carbide drift layer;
   wherein said p-type epitaxial silicon carbide base layer is formed as a mesa having a sidewall which extends through said p-type epitaxial silicon carbide base layer and to said n-type drift layer;
   an insulating layer formed on said n-type drift layer adjacent and disposed from said sidewall;
   a second n-type conductivity region of silicon carbide formed in said drift layer adjacent said sidewalls of said mesa, said second-n-type conductivity region having a higher carrier concentration than said drift layer;
   a gate contact on said insulating layer and extending over a portion of said first n-type region;
   a collector contact on a surface of said silicon carbide substrate opposite said drift layer;
   a first p-type region of silicon carbide in said base layer and a second p-type region form adjacent said second n-type conductivity region and extending into said n-type drift region below said second n-type conductivity region and below said gate contact, said first and second p-type regions being electrically connected and having a carrier concentration greater than the carrier concentration of said p-type epitaxial base layer and said first p-type region being formed so as to convert electrons flowing through said first n-type region into holes for injection into said p-type base layer;
   a conductive strap formed at base of said sidewall so as to electrically connect said second n-type conductivity region with said first p-type region of silicon carbide; and
   an emitter contact on said first n-type region of silicon carbide.

8. The unit cell according to claim 7 wherein the first and second regions of p-type silicon carbide comprise a continuous region of p-type silicon carbide formed in said base layer adjacent a sidewall of said mesa and said second n-type conductivity region and extending into and below said gate contact.

9. The unit cell according to claim 7, wherein the sidewall has a slope of less than about 60 degrees.

10. The unit cell according to claim 9, wherein the slope of the sidewall is selected so as to produce said second p-type regions of silicon carbide when p-type ions are implanted at a predetermined depth in said drift layer.

11. The unit cell according to claim 7, wherein said sidewall comprises two sidewalls so as to provide a step in the sidewall of said mesa;
   wherein said first and second p-type regions of silicon carbide comprise:

a first p-type region of silicon carbide formed in said p-type epitaxial base layer adjacent said step; and a second p-type region of silicon carbide formed in said n-type drift layer adjacent said second n-type conductivity region, extending into said n-type drift layer below said gate contact and extending to said p-type base layer.

12. The unit cell according to claim 11, wherein said second p-type region is formed so as to be exposed at a surface of if said drift layer and wherein said conductive strap electrically connects said first p-type region with said second p-type region and said second n-type region.

13. The unit cell according to claim 12, further comprising an insulating layer formed on the sidewall of said mesa between said drift layer and said step and extending onto said step and wherein said conducting strap is formed on said insulating layer.

14. The unit cell according to claim 7, wherein said p-type base layer has a thickness of from about 0.3 $\mu$m to about 5 $\mu$m.

15. The unit cell according to claim 7, wherein said n-type drift region has a thickness of from about 3 $\mu$m to about 500 $\mu$m.

16. The unit cell according to claim 7, wherein said n-type drift region has a carrier concentration of from about $10^{12}$ to about $10^{17}$ cm$^{-3}$.

17. The unit cell according to claim 7, wherein said p-type epitaxial base layer has a carrier concentration of from about $10^{16}$ to about $10^{18}$ cm$^{-3}$.

18. A unit cell according to claim 7 wherein said insulating layer comprises an oxide layer.

19. A MOS gated bipolar transistor comprising a plurality of the unit cells of claim 7.

20. A unit cell according to claim 7, wherein said second p-type region extends beneath the gate contact a distance of from about 3 $\mu$m to about 12 $\mu$m.

21. A unit cell according to claim 7, wherein the second n-type conductivity region extends into the n-type drift layer to a depth of from about 0.3 $\mu$m to about 5 $\mu$m.

* * * * *